United States Patent
Levesque

(10) Patent No.: US 9,680,426 B2
(45) Date of Patent: Jun. 13, 2017

(54) POWER AMPLIFIERS WITH TUNABLE NOTCHES

(71) Applicant: TDK Corporation, Tokyo (JP)

(72) Inventor: Chris Levesque, Fountain Valley, CA (US)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/081,401

(22) Filed: Mar. 25, 2016

(65) Prior Publication Data
US 2016/0285426 A1 Sep. 29, 2016

Related U.S. Application Data

(60) Provisional application No. 62/139,283, filed on Mar. 27, 2015.

(51) Int. Cl.
- *H03F 3/04* (2006.01)
- *H03F 3/19* (2006.01)
- *H03F 1/56* (2006.01)
- *H03F 3/24* (2006.01)

(52) U.S. Cl.
CPC .............. *H03F 3/19* (2013.01); *H03F 1/565* (2013.01); *H03F 3/245* (2013.01); *H03F 2200/168* (2013.01); *H03F 2200/267* (2013.01); *H03F 2200/318* (2013.01); *H03F 2200/411* (2013.01); *H03F 2200/451* (2013.01)

(58) Field of Classification Search
CPC ...................................................... H03F 3/04
USPC .................................. 330/295, 302, 306, 305
See application file for complete search history.

(56) References Cited

U.S. PATENT DOCUMENTS

| | | |
|---|---|---|
| 4,878,151 A | 10/1989 | Gallichio |
| 5,208,597 A | 5/1993 | Early et al. |
| 5,321,597 A | 6/1994 | Alacoque |
| 5,452,178 A | 9/1995 | Emesh et al. |
| 6,211,745 B1 | 4/2001 | Mucke et al. |
| 6,222,221 B1 | 4/2001 | Hou et al. |

(Continued)

FOREIGN PATENT DOCUMENTS

| | | |
|---|---|---|
| EP | 0 581 702 A1 | 2/1994 |
| JP | 63-308366 A | 12/1988 |

(Continued)

OTHER PUBLICATIONS

Chen, Ming-Jer et al., "A Novel Cross-Coupled Inter-Poly-Oxide Capacito for Mixed-Mode CMOS Processes", IEEE Electron Device Letters, vol. 20, No. 7, Jul. 1999.

(Continued)

*Primary Examiner* — Patricia T Nguyen
(74) *Attorney, Agent, or Firm* — Nixon Peabody LLP

(57) ABSTRACT

A power amplifier is described. A power amplifier includes at least a first amplifier stage. The power amplifier also includes a first notch filter coupled with the first amplifier stage. The first notch filter is configured to tune to a first frequency. The first notch filter including at least one first set of metal oxide semiconductor variable capacitor arrays. Moreover, the power amplifier includes a first mirrored notch filter coupled with said first amplifier stage. The first mirror notch filter is configured to tune to the mirror of the first frequency. The first mirror notch filter including at least one second set of metal oxide semiconductor variable capacitor arrays.

20 Claims, 20 Drawing Sheets

(56) References Cited

U.S. PATENT DOCUMENTS

| | | | |
|---|---|---|---|
| 6,351,020 B1 | 2/2002 | Tarabbia et al. | |
| 6,377,075 B1 | 4/2002 | Wong | |
| 6,410,954 B1 | 6/2002 | Sowlati et al. | |
| 6,657,509 B1 | 12/2003 | Ohannes | |
| 6,674,321 B1 | 1/2004 | York | |
| 6,765,778 B1 | 7/2004 | Du et al. | |
| 6,885,081 B2 | 4/2005 | Morimoto | |
| 7,000,000 B1 | 2/2006 | O'Brien | |
| 7,145,397 B2* | 12/2006 | Yamamoto | H03F 1/52 330/298 |
| 7,245,519 B2 | 7/2007 | McQuirk et al. | |
| 7,251,121 B2 | 7/2007 | Bhutta | |
| 7,280,001 B2 | 10/2007 | Maligeorgos et al. | |
| 7,408,422 B2 | 8/2008 | Dedieu et al. | |
| 7,453,136 B2 | 11/2008 | Hakkarainen et al. | |
| 7,528,667 B1 | 5/2009 | Tan et al. | |
| 7,920,030 B2 | 4/2011 | Jang et al. | |
| 8,134,222 B2 | 3/2012 | Khan et al. | |
| 8,324,069 B1 | 12/2012 | Carns et al. | |
| 8,395,880 B2 | 3/2013 | Wasson | |
| 8,531,862 B2 | 9/2013 | Roest et al. | |
| 9,019,007 B2 | 4/2015 | Gupta et al. | |
| 9,086,709 B2 | 7/2015 | Gupta et al. | |
| 9,110,483 B2 | 8/2015 | Madan et al. | |
| 9,201,442 B2 | 12/2015 | Gupta et al. | |
| 9,461,609 B2 | 10/2016 | Madan et al. | |
| 9,461,610 B2 | 10/2016 | Madan et al. | |
| 2002/0140115 A1 | 10/2002 | Inoh et al. | |
| 2004/0066244 A1 | 4/2004 | Takinami et al. | |
| 2004/0127167 A1 | 7/2004 | Zipper et al. | |
| 2005/0030116 A1 | 2/2005 | Takagi | |
| 2005/0184812 A1 | 8/2005 | Cho | |
| 2006/0006431 A1 | 1/2006 | Jean et al. | |
| 2006/0043499 A1 | 3/2006 | De Cremoux et al. | |
| 2006/0125121 A1 | 6/2006 | Ko et al. | |
| 2007/0057729 A1* | 3/2007 | Yamamoto | H03F 1/302 330/285 |
| 2007/0075791 A1 | 4/2007 | Dedieu et al. | |
| 2007/0140391 A1* | 6/2007 | Pan | H04B 1/0032 375/350 |
| 2008/0048236 A1 | 2/2008 | Kim | |
| 2008/0197923 A1 | 8/2008 | Nakajima et al. | |
| 2008/0265977 A1 | 10/2008 | Gu | |
| 2008/0267270 A1 | 10/2008 | Darabi | |
| 2009/0096507 A1 | 4/2009 | Gao et al. | |
| 2009/0128992 A1 | 5/2009 | Haralabiois | |
| 2009/0160263 A1 | 6/2009 | Spears et al. | |
| 2009/0243743 A1 | 10/2009 | Kossel et al. | |
| 2009/0325521 A1 | 12/2009 | Dubash et al. | |
| 2010/0052778 A1 | 3/2010 | Baranauskas et al. | |
| 2010/0079167 A1 | 4/2010 | Thomsen | |
| 2010/0134182 A1 | 6/2010 | Kapoor et al. | |
| 2011/0002080 A1 | 1/2011 | Ranta | |
| 2011/0109380 A1 | 5/2011 | Park et al. | |
| 2011/0121910 A1 | 5/2011 | Yang et al. | |
| 2011/0291753 A1* | 12/2011 | Ginsburg | H03F 3/005 330/7 |
| 2011/0298526 A1 | 12/2011 | Homol et al. | |
| 2011/0316062 A1 | 12/2011 | Kondo et al. | |
| 2012/0211868 A1 | 8/2012 | Stribley et al. | |
| 2012/0213015 A1 | 8/2012 | Romanovskyy et al. | |
| 2013/0090067 A1 | 4/2013 | Rofougaran et al. | |
| 2014/0009211 A1 | 1/2014 | Madan et al. | |
| 2014/0062575 A1 | 3/2014 | Hurwitz | |
| 2014/0266408 A1 | 9/2014 | Guimaraes et al. | |
| 2014/0367831 A1 | 12/2014 | Yen et al. | |
| 2016/0161970 A1 | 6/2016 | Gupta et al. | |
| 2016/0163464 A1 | 6/2016 | Madan et al. | |
| 2016/0163697 A1 | 6/2016 | Madan et al. | |
| 2016/0164482 A1 | 6/2016 | Madan et al. | |
| 2016/0179124 A1* | 6/2016 | Madan | G05F 3/262 323/313 |

FOREIGN PATENT DOCUMENTS

| | | |
|---|---|---|
| JP | 2006-128468 A | 5/2006 |
| WO | WO 2013/028546 A1 | 2/2013 |
| WO | WO 2014/193503 A1 | 12/2014 |
| WO | WO 2014/193846 A1 | 12/2014 |

OTHER PUBLICATIONS

Han Q. et al., "Perturbation Analysis and Experimental Verification of Intermodulation and Harmonic Distortion for an Anti-Series Varactor Pair", IEICE Transactions on Electronics, vol. E88-C, No. 1, Jan. 2005, pp. 89-97.

Kampe, A. et al., "An LC-VCO with one octave tuning range," IEEE European Conference on Circuit Theory and Design, vol. 3, Aug. 29, 2005, pp. 321-324.

Nakamura, T. et al., "A Low-Phase-Noise Low-Power 27-GHz SiGe-VCO using Merged-Transformer Matching Circuit Technique," IEEE Radio Frequency Integrated Circuits Symposium, Jun. 2007, pp. 413-416.

Pietro Andreani et al., "On the Use of MOS Varactors in RF VCO's", IEEE Journal of Solid-State Circuits, vol. 35, No. 6, Jun. 2000, pp. 905-910.

Sauerbrey J. et al., "A 0.7-V MOSFET-Only Switched-Opamp Sigmadelta Modulator in Standard Digital CMOS Technology", IEEE Journal of Solid-State Circuits, vol. 37, No. 12, Dec. 2002, pp. 1662-1669.

Zhiqiang et al., "A Multi-Band RF CMOS LC Bandpass Filter with Continuous Frequency Tuning Design," 2010 International Conference on Computer Application and System Modeling (ICCASM 2010), 4 pages.

Office Action in U.S. Appl. No. 14/014,496, mailed May 12, 2014.

Office Action in U.S. Appl. No. 14/014,496, mailed Dec. 31, 2014.

Notice of Allowance in U.S. Appl. No. 14/014,496, mailed Mar. 25, 2015.

International Search Report and Written Opinion for International Application No. PCT/US2014/018673, mailed Jun. 5, 2014.

Notice of Allowance in U.S. Appl. No. 14/288,115, mailed May 29, 2015.

Corrected Notice of Allowance in U.S. Appl. No. 14/288,115, mailed Jun. 10, 2015.

Invitation to Pay Additional Fees with Communication Relating to the Results of the Partial International Search in International Application No. PCT/US2014/039599 mailed Aug. 12, 2014.

International Search Report and Written Opinion for International Application No. PCT/US2014/039599, mailed Nov. 13, 2014.

Office Action in U.S. Appl. No. 14/601,137, mailed Apr. 30, 2015.

Notice of Allowance in U.S. Appl. No. 14/601,137, mailed Jun. 24, 2015.

Corrected Notice of Allowance in U.S. Appl. No. 14/601,137, mailed Jul. 10, 2015.

Office Action in U.S. Appl. No. 14/674,701, mailed May 13, 2015.

Office Action in U.S. Appl. No. 14/674,701, mailed Jun. 9, 2015.

Notice of Allowance in U.S. Appl. No. 14/674,701, mailed Oct. 2, 2015.

Corrected Notice of Allowance in U.S. Appl. No. 14/674,701, mailed Oct. 22, 2015.

Office Action in U.S. Appl. No. 14/952,451, mailed Apr. 7, 2016.

Office Action in U.S. Appl. No. 14/952,451, mailed Sep. 16, 2016.

Office Action in U.S. Appl. No. 14/559,783, mailed Mar. 19, 2015.

Office Action in U.S. Appl. No. 14/559,783, mailed Jun. 18, 2015.

Notice of Allowance in U.S. Appl. No. 14/559,783, mailed Oct. 15, 2015.

Corrected Notice of Allowance in U.S. Appl. No. 14/559,783, mailed Nov. 3, 2015.

Office Action in U.S. Appl. No. 14/559,783, mailed Feb. 12, 2016.

Notice of Allowance in U.S. Appl. No. 14/559,783, mailed Jun. 9, 2016.

Office Action in U.S. Appl. No. 14/705,386, mailed Oct. 8, 2015.

Notice of Allowance in U.S. Appl. No. 14/705,386, mailed Jun. 8, 2016.

(56) References Cited

OTHER PUBLICATIONS

International Search Report and Written Opinion for International Application No. PCT/US2015/058999, mailed Feb. 29, 2016.
Office Action in U.S. Appl. No. 14/705,476, mailed Aug. 31, 2015.
Office Action in U.S. Appl. No. 14/705,476, mailed Nov. 9, 2015.
Office Action in U.S. Appl. No. 14/705,476, mailed Mar. 8, 2016.
Office Action in U.S. Appl. No. 14/705,476, mailed Sep. 2, 2016.
Office Action in U.S. Appl. No. 14/705,429, mailed Oct. 29, 2015.
Office Action in U.S. Appl. No. 14/705,429, mailed Mar. 31, 2016.
Notice of Allowance in U.S. Appl. No. 14/705,429, mailed Jul. 29, 2016.
Office Action in U.S. Appl. No. 14/705,381, mailed Jul. 31, 2015.
Office Action in U.S. Appl. No. 14/705,381, mailed Oct. 27, 2015.
Office Action in U.S. Appl. No. 14/705,381, mailed Mar. 22, 2016.
Office Action in U.S. Appl. No. 14/705,381, mailed Sep. 9, 2016.

\* cited by examiner

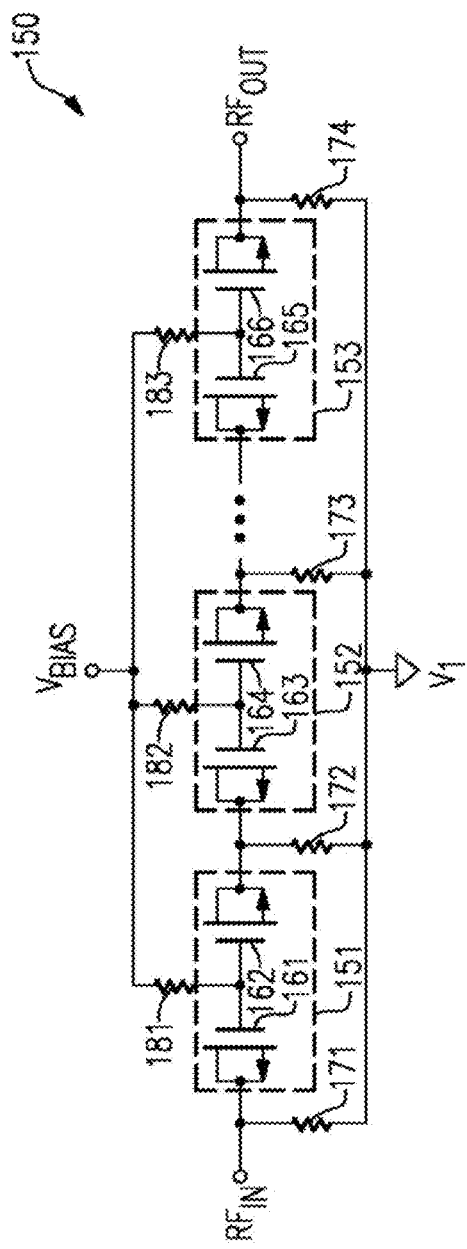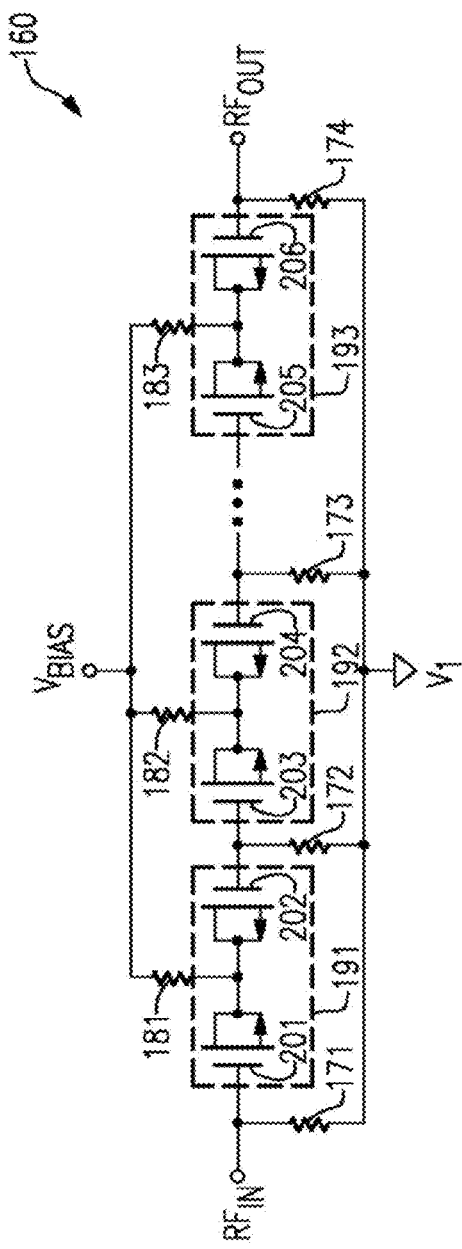
Figure 11A
Figure 11B

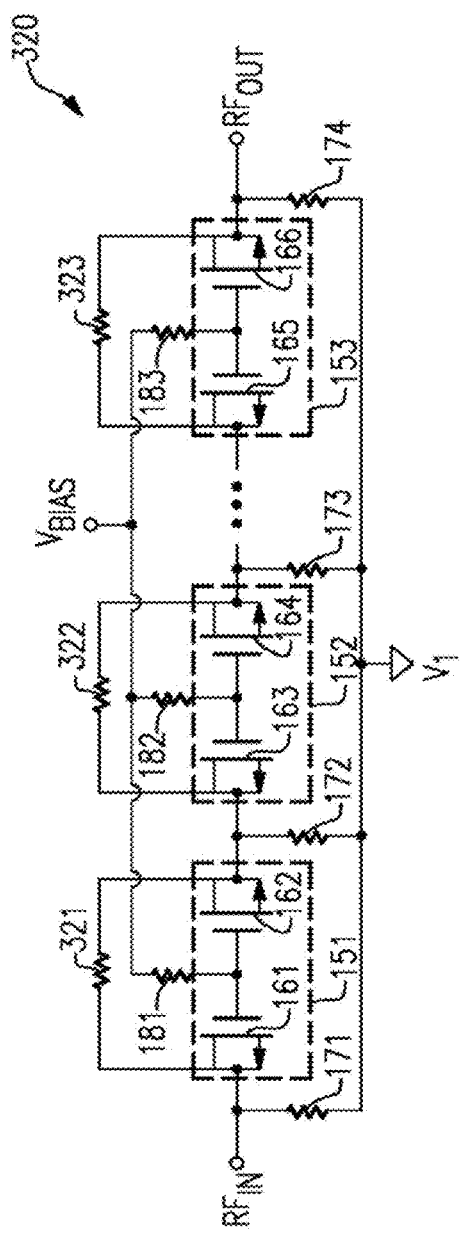
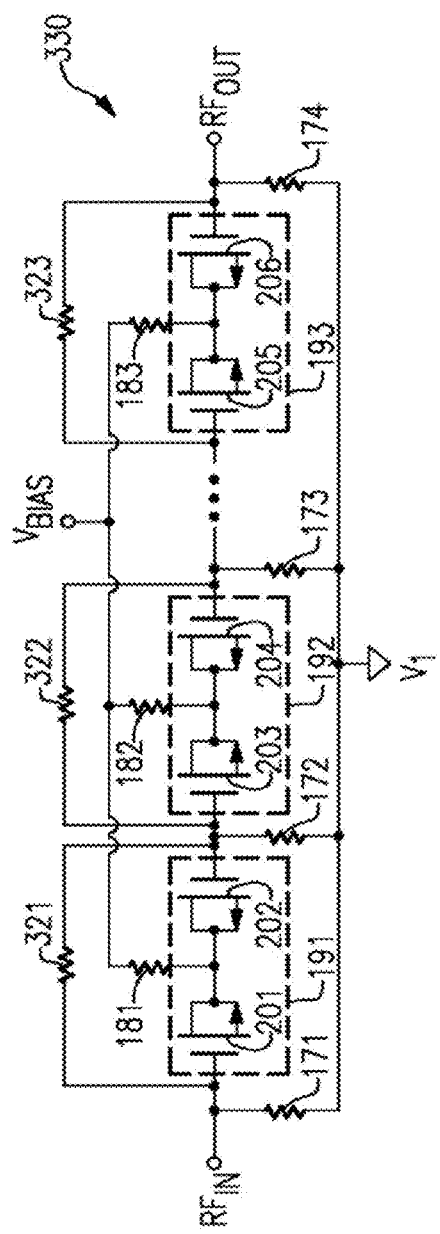
Figure 17A
Figure 17B

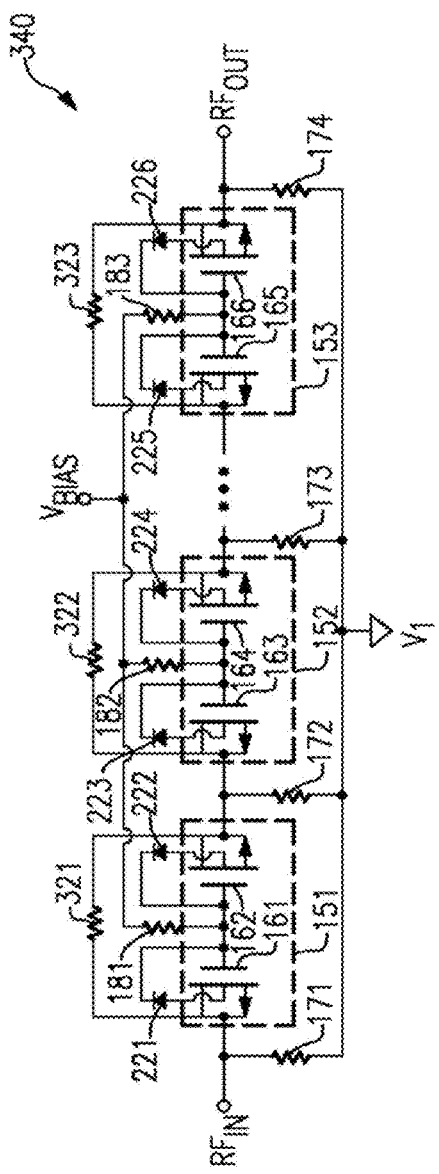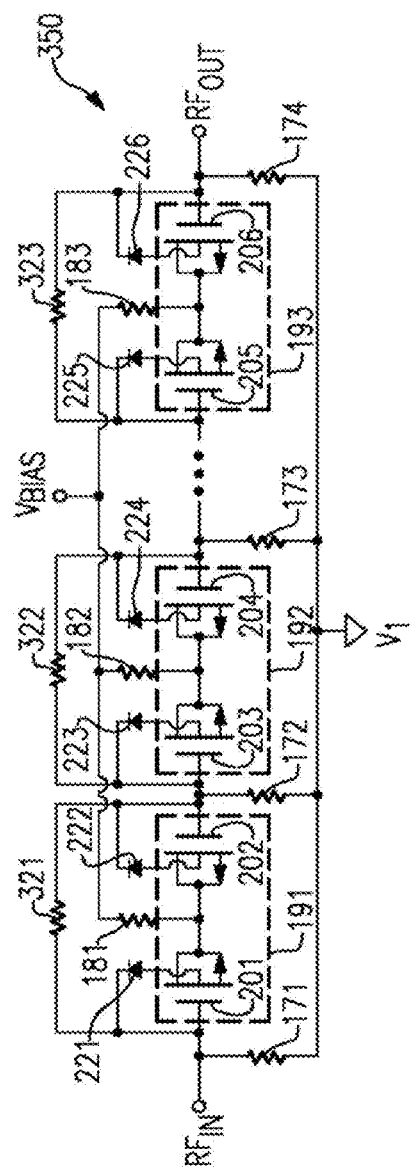
Figure 18A
Figure 18B

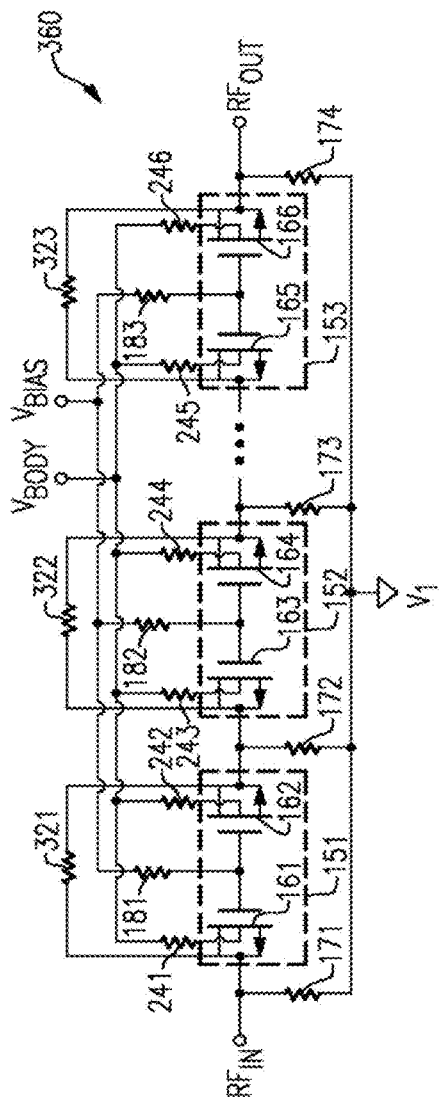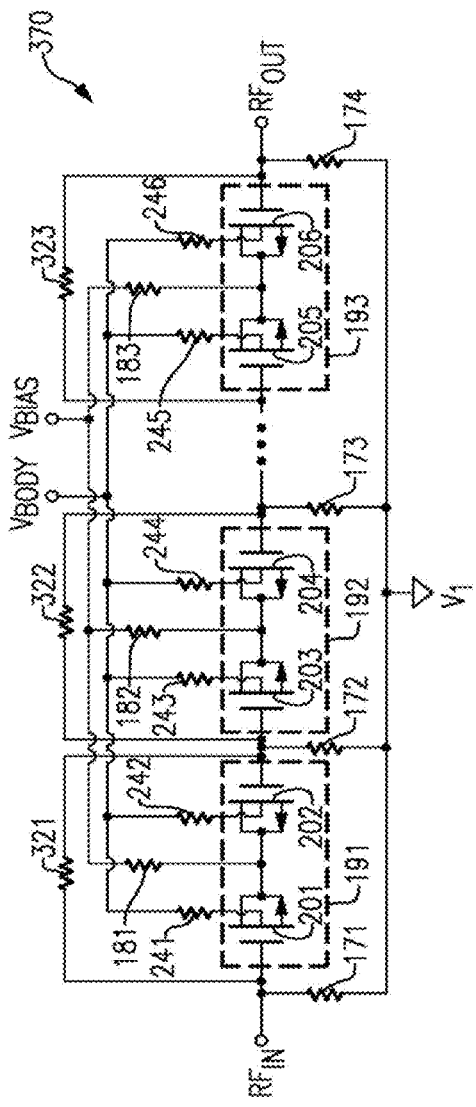
Figure 19A
Figure 19B

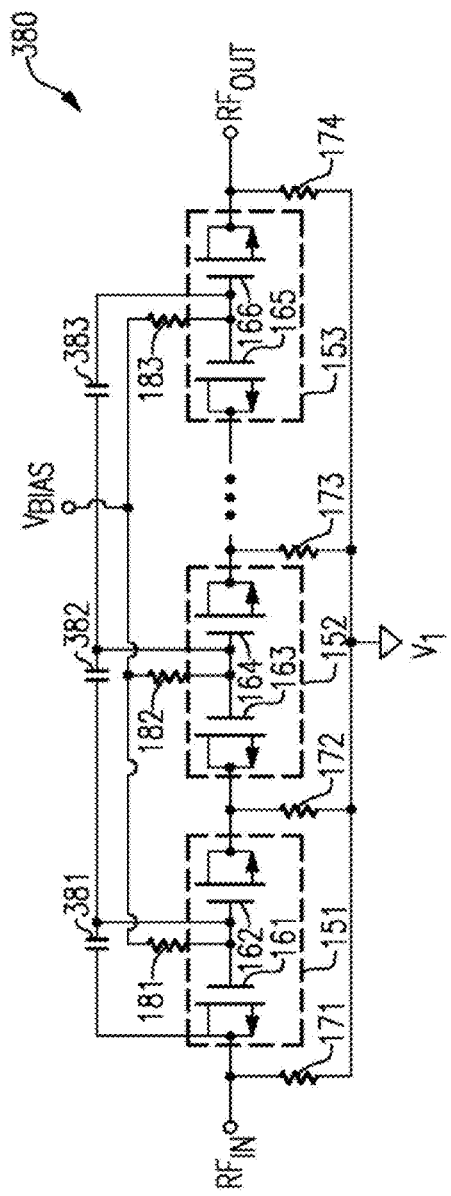
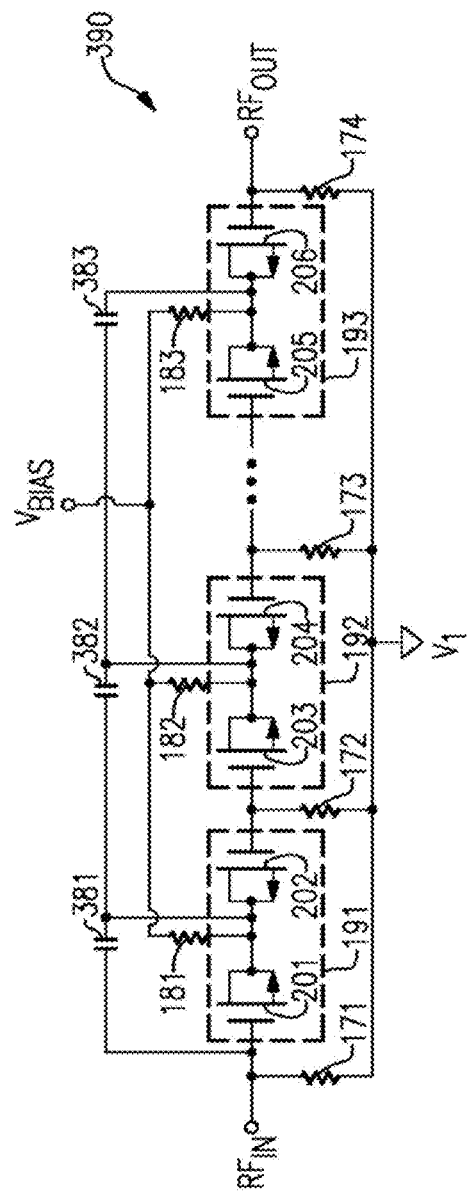
Figure 20A
Figure 20B

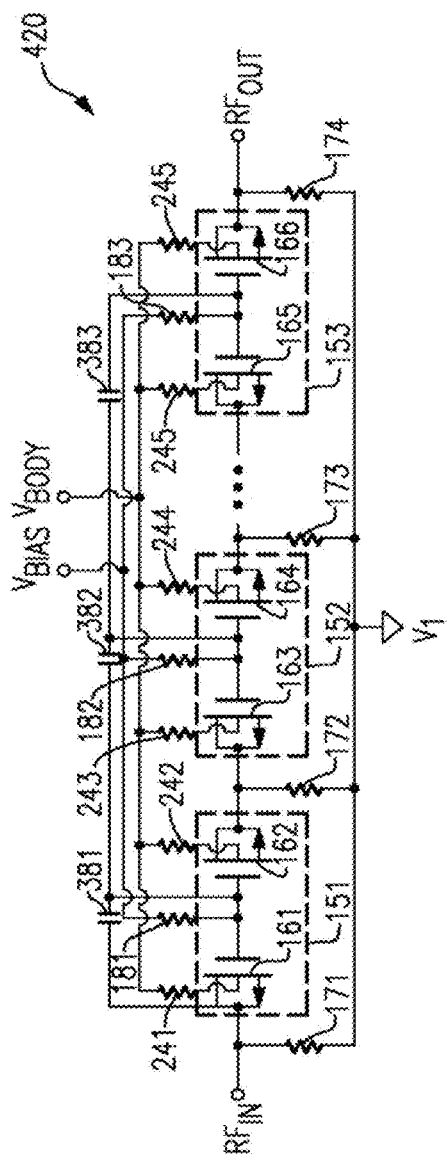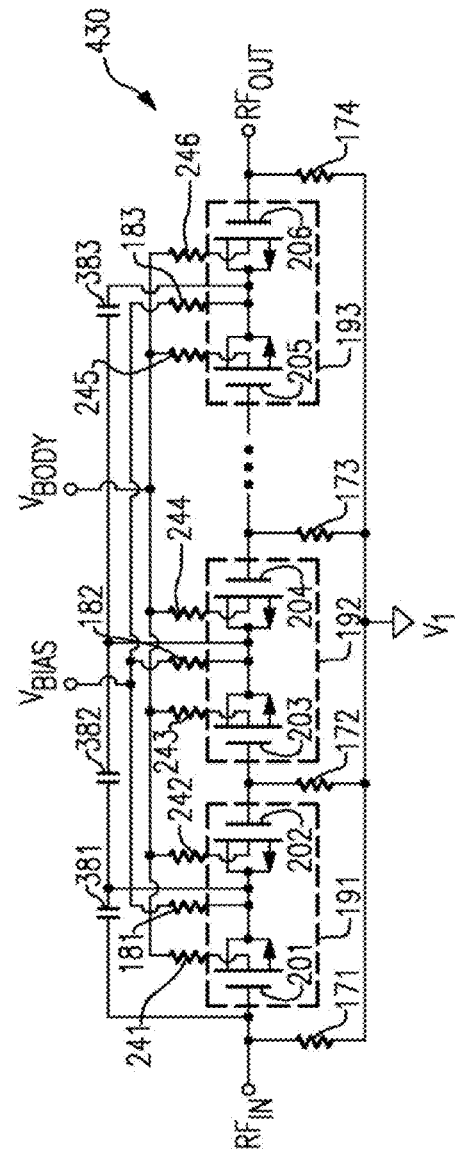
Figure 22A
Figure 22B

POWER AMPLIFIERS WITH TUNABLE NOTCHES

CROSS-REFERENCE TO RELATED APPLICATIONS

This application claims the benefit of U.S. Provisional Application No. 62/139,283 filed on Mar. 27, 2015, which is hereby incorporated by reference in its entirety.

FIELD

Embodiments of the invention relate to electronic systems and, in particular, to power amplifiers in radio frequency systems.

BACKGROUND

A wireless device such as a smart phone, tablet, or laptop computer can communicate over multiple frequency bands using one or more common or shared antennas. A desire to transmit at wider bandwidth and/or over different communications networks has increased a demand for the number of bands that a wireless device can communicate over. For example, a wireless device may be specified to operate using one or more of a variety of communications standards including, for example, GSM/EDGE, IMT-2000 (3G), 4G, Long Term Evolution (LTE), Advanced LTE, IEEE 802.11 (Wi-Fi), Mobile WiMAX, Near Field Communication (NFC), Global Positioning System (GPS), GLONASS, Galileo, Bluetooth, and the like. Proprietary standards can also be applicable. The complexities of multi-band communication can be further exacerbated in configurations in which the wireless device is specified to use carrier aggregation.

SUMMARY

A power amplifier is described. A power amplifier includes at least a first amplifier stage. The power amplifier also includes a first notch filter coupled with the first amplifier stage. The first notch filter is configured to tune to a first frequency. The first notch filter including at least one first set of metal oxide semiconductor variable capacitor arrays. Moreover, the power amplifier includes a first mirrored notch filter coupled with said first amplifier stage. The first mirror notch filter is configured to tune to the mirror of the first frequency. The first mirror notch filter including at least one second set of metal oxide semiconductor variable capacitor arrays.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which:

FIG. 11A illustrates a circuit diagram of a variable capacitor cell according to one embodiment;

FIG. 11B illustrates a circuit diagram of a variable capacitor cell according to another embodiment;

FIG. 17A illustrates a circuit diagram of a variable capacitor cell according to another embodiment;

FIG. 17B illustrates a circuit diagram of a variable capacitor cell according to another embodiment;

FIG. 18A illustrates a circuit diagram of a variable capacitor cell according to another embodiment;

FIG. 18B illustrates a circuit diagram of a variable capacitor cell according to another embodiment;

FIG. 19A illustrates a circuit diagram of a variable capacitor cell according to another embodiment;

FIG. 19B illustrates a circuit diagram of a variable capacitor cell according to another embodiment;

FIG. 20A illustrates a circuit diagram of a variable capacitor cell according to another embodiment;

FIG. 20B illustrates a circuit diagram of a variable capacitor cell according to another embodiment;

FIG. 22A illustrates a circuit diagram of a variable capacitor cell according to another embodiment;

FIG. 22B illustrates a circuit diagram of a variable capacitor cell according to another embodiment;

DETAILED DESCRIPTION

Embodiments of power amplifier systems with tunable notches are described. In particular, a power amplifier system is described that is configured to include one or more amplifier stages and tunable notch filters. The tunable notch filters including metal oxide semiconductor variable capacitor arrays. Some embodiments of a power amplifier system include one or more matching networks. For various embodiments, a power amplifier system includes one or more tunable matching networks including metal oxide semiconductor variable capacitor arrays.

In one aspect, tunable notch filter are included in a power amplifier (PA) system to reduce PA noise.

In certain configurations, a power amplifier amplification path includes a pair of notch filters. For various embodiments, a first notch filter is tuned to filter out an unwanted frequency. For example, when a PA system is part of a transceiver, which includes both an RF transmitter and an RF receiver, the first notch filter is configured as an RX notch filter tuned to a receive (RX) frequency to filter out the receive frequency from the transmit path. A second notch filter in the PA system is tuned to filter out a mirror or image of the unwanted frequency. In the example of a PA system including a second notch filter configured as a mirror notch filter tuned to filter out a receive (RX) frequency, the second notch filter is tuned to the mirror or image of the RX frequency, where the mirror of the RX frequency is the sideband frequency not being used as the RX frequency.

Figure 1:
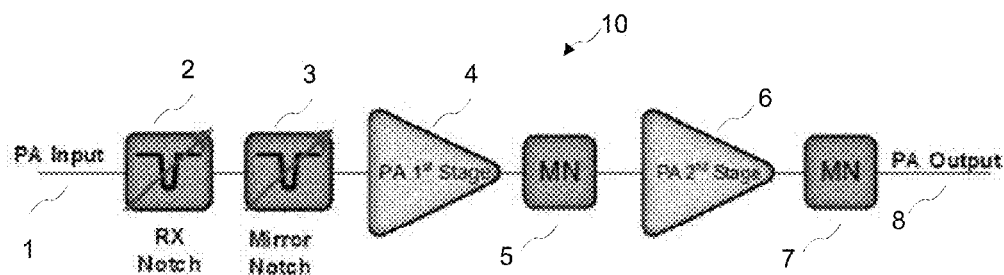
FIG. 1 illustrates a schematic diagram of a power amplifier system according to a first embodiment.

FIG. 1 illustrates a power amplifier system 10 according to a first embodiment. The power amplifier system 10 includes power amplifier input 1. The power amplifier input 1 is configured to receive a radio frequency (RF) signal using techniques including those known in the art. Moreover, the power amplifier system 10 includes a RX notch filter 2 and a mirror notch filter 3. For an embodiment, a RX notch filter 2 and a mirror notch filter 3 are inserted in a signal path before a first amplifier stage (PA's first stage). The RX notch filter 2 is coupled with the PA input and the mirror notch filter 3 is coupled with the output of the RX notch filter 2. The input of the first amplifier stage 4 is coupled with the RX notch filter 2.

In certain configurations, at least one of the RX notch filter 2 and the mirror notch filter 3 is implemented using one or more metal oxide semiconductor (MOS) variable capacitor arrays. Examples of MOS variable capacitor arrays are described in U.S. patent application Ser. No. 14/559,783 and in U.S. Patent Publication No. 2014/0354348, now U.S. Pat. No. 9,086,709, each of which is hereby expressly incorporated by reference herein.

Moreover, the PA system includes a second amplification stage 6 (PA second stage). An amplifier stage includes, but is not limited to, at least one of any of a transistor, a vacuum tube, and other devices configured to amplify an RF signal using techniques including those known in the art. The second amplification stage 6 coupled with the output of the first amplification stage 4. For various embodiments, the second amplification stage 6 is coupled with the first amplifier stage 4 through a first matching network 5. Various embodiments also include a second matching network 7 coupled with the output of the second amplifier stage 6 and the output of the PA system (PA output) 8. A matching filter includes, but is not limited to, a lumped elements network, a stub, a matching transformer, or other circuit configured to match a first impedance with a second impedance using techniques including those known in the art.

Figure 2:
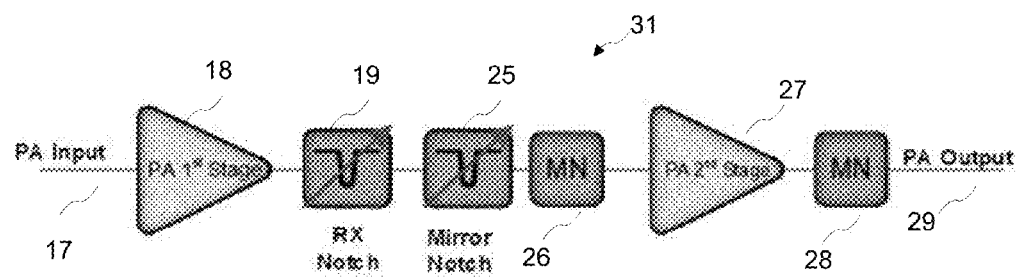
FIG. 2 illustrates a schematic diagram of a power amplifier system according to a second embodiment.

FIG. 2 illustrates a power amplifier system according to a second embodiment. The power amplifier system 31 includes a RX notch filter 19 and a mirror notch filter 25 inserted in a signal path between a first amplifier stage 18 and a second amplifier stage 27 of a PA system 31, such that the output of the first amplifier stage 18 is coupled with the input of the RX notch filter 19 and the output of the mirror notch filter 25 is coupled with the input of the second amplifier stage 27. The first amplifier stage 18 coupled with PA input 17. Including the RX notch filter 19 and the mirror notch filter 25 between stages of a PA system 31 can provide superior noise rejection. For various embodiments, the mirror notch filter 25 is coupled with the input of the second amplifier stage 27 through a first matching network 26. The second amplifier stage 27 may optionally be coupled with the PA output 29 through a second matching network 28.

Figure 3:
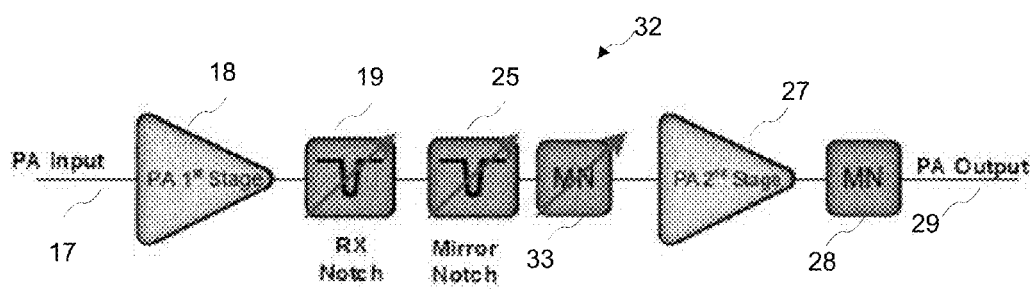
FIG. 3 illustrates a schematic diagram of a power amplifier system according to a third embodiment.

FIG. 3 is a schematic diagram of third embodiment of a power amplifier system. The power amplifier system 32 of FIG. 3 is similar to the power amplifier system 31 of FIG. 2, except that the power amplifier system 32 of FIG. 3 includes a tunable inter-stage matching network 33. In certain configurations, the tunable inter-stage matching network 33 is implemented using one or more metal oxide semiconductor (MOS) variable capacitor arrays. For various embodiments, a matching network 28 coupled with the PA output 29 may also be implemented using one or more metal oxide semiconductor (MOS) variable capacitor arrays.

In certain configurations, a PA that includes a tunable matching network on the PA output. For various embodiments, a tunable matching network is implemented using a single lumped elements matching network using techniques including those known in the art. Including a tunable network in this manner helps absorb an imaginary part of the PA's output impedance. For example, the magnitude of the imaginary part of the impedance generally gets larger as we move away from a center frequency at which a fixed network is normally optimized. This results in an impedance mismatch between the PA output and a component coupled with the PA output, including, but not limited to, a duplexer and an antenna. The impedance mismatch results in higher insertion loss, which consequently uses more PA power and reduces the system efficiency.

Although illustrated in the context of two stages PAs, the teachings herein are applicable to PAs including more or fewer amplifier stages.

Figure 4:
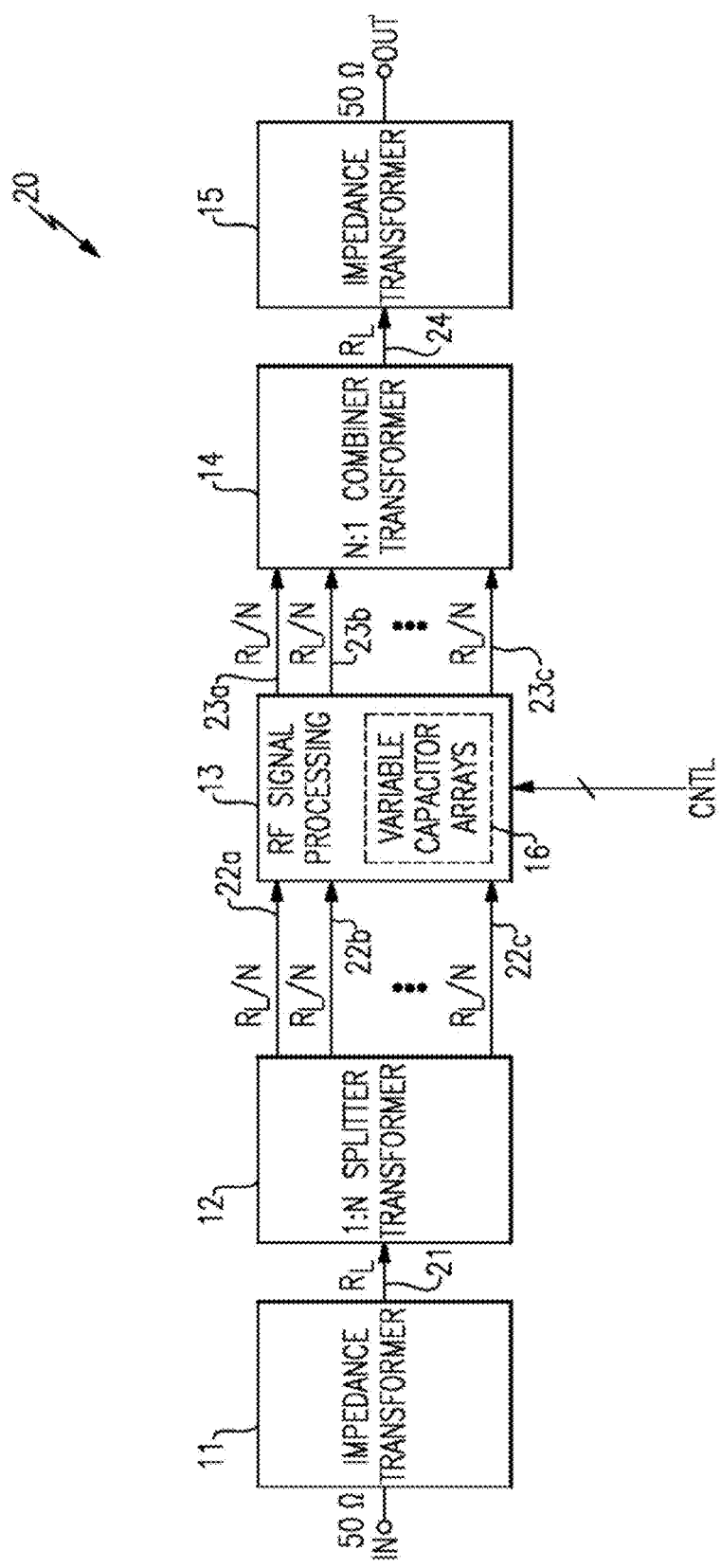
FIG. 4 illustrates a schematic diagram of a programmable filter according to an embodiment.

FIG. 4 is a schematic diagram of a programmable filter 20 according to one embodiment. The programmable filter 20 includes an input impedance transformer 11, a splitter transformer 12, an RF signal processing circuit 13, a combiner transformer 14, and an output impedance transformer 15. The programmable filter 20 further includes an RF input IN and an RF output OUT. For various embodiments, the programmable filter 20 is configured as a tunable notch filter or a tunable mirror filter including those described herein.

The input impedance transformer 11 can receive an RF input signal on the RF input IN, and can generate an impedance transformed signal 21. The input impedance transformer 11 can provide an impedance transformation from input to output. For example, in one embodiment, the input impedance transformer 11 transforms an input impedance of about 50Ω to an output impedance of about $R_L$, where $R_L$ is less than 50Ω, for example, 8Ω.

Transforming the input impedance of the programmable filter 20 in this manner can result in the impedance transformed signal 21 having a smaller voltage level relative to a voltage level of the RF input signal received at the RF input IN. For example, when the programmable filter 20 has an input impedance of about 50Ω, the voltage level of the impedance transformed signal 21 can be smaller than the voltage level of the RF input signal by a factor of about $\sqrt{50/R_L}$.

The splitter transformer 12 can receive the impedance transformed signal 21 from the input impedance transformer 11, and can generate N split signals, where N is an integer greater than or equal to 2. In the illustrated configuration, the splitter transformer 12 generates a first split signal 22a, a second split signal 22b, and a third split signal 22c. Although an example with N=3 has been illustrated, the principles and advantages disclosed herein are applicable to a broad range of values for the integer N, including 2, 3, 4, 5, or 6 or more.

Splitting the impedance transformed signal 21 into N split signals can further decrease a voltage level of the RF input signal by a factor of N. Including the splitter transformer 12 can also reduce the impedance by a factor of N. For example, when the output impedance of the input impedance transformer 11 has a value of $R_L$, the output impedance of each output of the splitter transformer 12 can have a value of $R_L/N$.

As shown in FIG. 4, the RF signal processing circuit 13 can receive the first, second, and third split signals 22a-22c, and can generate first, second, and third processed RF signals 23a-23c, respectively. As illustrated in FIG. 4, the RF signal processing circuit 13 includes variable capacitor arrays 16, which can be used to control a filtering characteristic of the RF signal processing circuit 13. The RF signal processing circuit 13 further receives a control signal CNTL, which can be used to control the capacitances of the variable capacitor arrays 16.

The illustrated RF signal processing circuit 13 can be used to process the split signals 22a-22c generated by the splitter transformer 12 to generate the processed signals 23a-23c, respectively. In certain configurations, the RF signal processing circuit 13 can include substantially identical circuitry in the signal paths between the RF signal processing circuit's inputs and outputs.

The combiner transformer 14 receives the processed signals 23a-23c, which the combiner transformer 14 can combine to generate a combined signal 24. The combiner transformer 14 can also provide an impedance transformation. For example, in a configuration in which each output of the RF signal processing circuit 13 has an output impedance of about $R_L/N$, the combiner transformer 14 can have an output impedance of about $R_L$.

The output impedance transformer 15 receives the combined signal 24 from the combiner transformer 14, and generates the RF output signal on the RF output OUT. In certain configurations, the combiner transformer 14 can have an output impedance $R_L$ that is less than 50Ω, and the output impedance transformer 15 can be used to provide the RF output signal at an output impedance of about 50Ω.

The illustrated programmable filter 20 provides filtering using the RF signal processing circuit 13, which processes the split signals 22a-22c at lower impedance relative to the programmable filter's input impedance. Thereafter, the processed signals 23a-23c are combined and transformed up in impedance. For example, in one embodiment, the programmable filter's output impedance is about equal to the programmable filter's input impedance.

Configuring the programmable filter 20 to process an RF input signal in this manner can increase the programmable filter's voltage handling capability. For example, when the programmable filter 20 has an input impedance of about 50Ω, the voltage level of the RF input signal can be decreased by a factor of about $N\sqrt{50/R_L}$ before it is provided to the RF signal processing circuit 13, which may include circuitry that is sensitive to high voltage conditions. Accordingly, the illustrated programmable filter 20 can be used to process high voltage RF input signals and/or can have enhanced robustness to variations in voltage standing wave ratio (VWSR).

Furthermore, configuring the programmable filter 20 to process the RF signal at lower impedance can enhance the programmable filter's linearity. In one embodiment, the illustrated configuration can reduce the third-order intermodulation distortion (IMD3) by a factor of about 40 $\log_{10} N\sqrt{50/R_L}$ relative to a configuration in which an RF input signal is provided directly to an RF signal processing circuit without impedance transformation or splitting. In one illustrative example, N can be selected to be equal to 8 and $R_L$ can be selected to be about equal to about 8Ω, and the programmable filter can provide a linearity improvement of about 52 dB. However, other configurations are possible.

Figure 5:
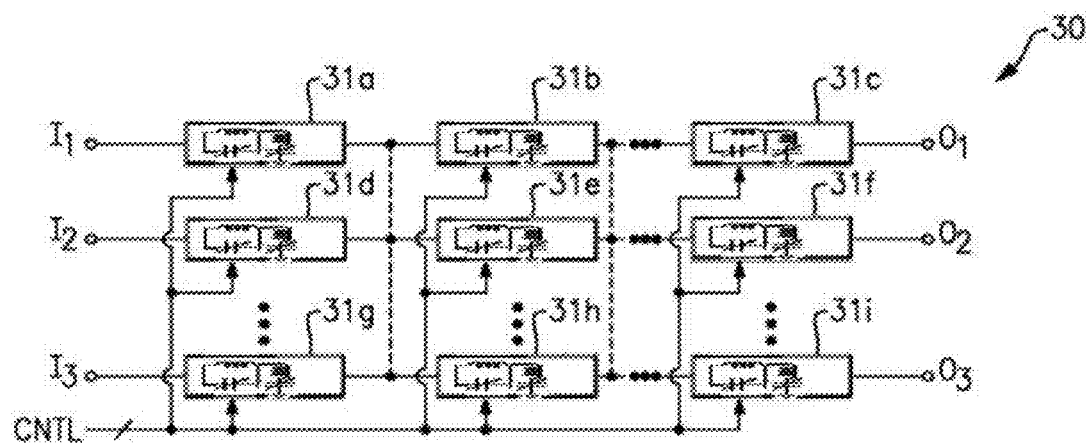
FIG. 5 illustrates a schematic diagram of one embodiment of an RF signal processing circuit.

FIG. 5 is a schematic diagram of one embodiment of an RF signal processing circuit 30. The RF signal processing circuit 30 includes a first inductor-capacitor (LC) circuit 31a, a second LC circuit 31b, a third LC circuit 31c, a fourth LC circuit 31d, a fifth LC circuit 31e, a sixth LC circuit 31f, a seventh LC circuit 31g, an eighth LC circuit 31h, and a ninth LC circuit 31i. The RF signal processing circuit 30 illustrates one embodiment of the RF signal processing circuit 13 of FIG. 4.

As shown in FIG. 5, the first, second, and third LC circuits 31a-31c are arranged in a cascade between a first RF input $I_1$ and a first RF output $O_1$. Additionally, the fourth, fifth, and sixth LC circuits 31d-31f are arranged in a cascade between a second RF input $I_2$ and a second RF output $O_2$. Furthermore, the seventh, eighth, and ninth LC circuits 31g-31i are arranged in a cascade between a third RF input $I_3$ and a third RF output $O_3$.

Although FIG. 5 illustrates a configuration including three RF inputs and three RF outputs, the RF signal processing circuit 30 can be adapted to include more or fewer inputs and outputs.

The RF signal processing circuit 30 can be used to process RF input signals received on the first to third RF inputs $I_1$-$I_3$ to generate RF output signals on the first to third RF outputs $O_1$-$O_3$. As shown in FIG. 5, the RF signal processing circuit 30 receives a control signal CNTL, which can be used to control one or more variable capacitances associated with the first to ninth LC circuits 31a-31i. By controlling the LC circuits' capacitances, the control signal CNTL can be used to tune a frequency response of the RF signal processing circuit 30.

In one embodiment, the RF signal processing circuit 30 is configured to operate as a notch filter using techniques including those known in the art, and the control signal CNTL can be used to control a location in frequency of the notch filter's stopband. However, other configurations are possible.

Although FIG. 5 illustrates a configuration including three LC circuits arranged in a cascade between each input and output, more or fewer LC circuits and/or other processing circuitry can be included.

Cascading LC circuits can increase a voltage handling capability of an RF signal processing circuit by limiting a voltage drop across individual circuit components of the LC circuits. For example, in certain implementations, the LC circuits 31a-31i are implemented using MOS capacitors, which can be damaged by large gate-to-drain and/or gate-to-source voltages. By arranging two or more LC circuits in a cascade, a voltage drop across the MOS capacitors during operation can be increased relative to a configuration including a single LC circuit between a particular input and output.

The RF signal processing circuit 30 illustrates one embodiment of the RF signal processing circuit 13 of FIG. 5. For example, in certain configurations, the first to third input RF inputs $I_1$-$I_3$ can receive the first to third RF split signals 22a-22c, respectively, and the first to third RF outputs $O_1$-$O_3$ can generate the first to third processed signals 23a-23c, respectively.

The RF signal processing circuit 30 includes a first signal path between the first RF input $I_1$ and the first RF output $O_1$, a second signal path between the second RF input $I_2$ and the second RF output $O_2$, and a third signal path between the third RF input $I_3$ and the third RF output $O_3$. In certain configurations, one or more electrical connections can be provided between corresponding positions along the first to third signals paths. For example, in certain implementations, the RF signal processing circuit 30 is used to process substantially identical RF input signals received on the first to third RF inputs $I_1$-$I_3$, respectively, to generate substantially identical RF output signals on the first to third RF outputs $O_1$-$O_3$. In such configurations, electrical connections can be provided along corresponding positions of signal paths, since the corresponding positions should have substantially the same voltage level. Examples of such electrical connections are illustrated in FIG. 5 with dashed lines.

Figure 6:
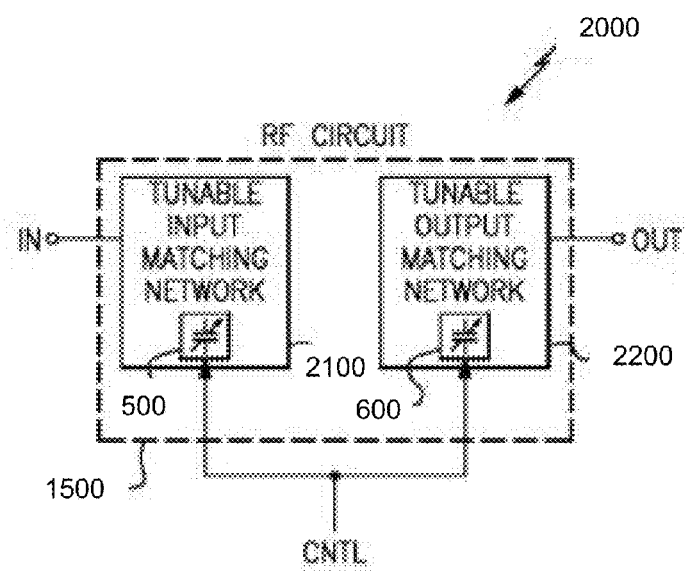
FIG. 6 illustrates a schematic diagram of a matching network according to an embodiment.

FIG. 6 is a schematic diagram of another embodiment of an RF system 2000, such as a PA system as described herein, that includes an RF circuit 1500. The RF circuit 1500 includes a first tunable matching network 2100 electrically connected to an RF input IN and a second tunable matching network 2200 electrically connected to an RF output OUT. As shown in FIG. 6, the first tunable network 2100 and the second tunable matching network 2200 include first and second variable capacitor arrays 500, 600, respectively. The tunable matching networks may be implemented as inter-stage matching networks in a PA system as described herein.

The first variable capacitor array 500 receives the control signal CNTL, which can be used to control the first variable capacitor array's capacitance. The capacitance of the first variable capacitor array 500 can be used to control, for example, an input impedance of the RF circuit 1500 and/or to control a ratio of impedance transformation provided by the tunable input matching network 2100. Additionally, the capacitance of the second variable capacitor array 600 can be controlled by the control signal CNTL, thereby controlling, for example, an output impedance of the RF circuit 1500 and/or a ratio of impedance transformation provided by the tunable output matching network 2200.

In one embodiment, the control signal CNTL is received over an interface, such as a serial peripheral interface (SPI) or Mobile Industry Processor Interface radio frequency front end (MIPI RFFE) interface. Although two examples of interfaces have been provided, other interfaces can be used. Although FIG. 6 illustrates the first and second variable capacitor arrays 500, 600 as receiving a common control signal CNTL, other configurations are possible, such as implementations in which the first and second variable capacitor arrays 500, 600 are controlled using separate control signals.

Including the tunable input matching network 2100 and the tunable output matching network 2200 can enhance performance in a variety of ways, such as improving performance under varying voltage standing wave ratio (VSWR). The first and second variable capacitor arrays 500, 600 can be implemented in accordance with the teachings herein to provide high RF voltage handling capabilities, high Q-factor, low insertion loss, and/or high linearity.

As described above, various embodiments of a notch filter and various embodiments of a matching network include one or more metal oxide semiconductor (MOS) variable capacitor arrays. For various embodiments, a variable capacitor array includes a plurality of variable capacitor cells electrically connected in parallel. Each of the variable capacitor cells can include a cascade of two or more pairs of anti-series metal oxide semiconductor (MOS) capacitors between an RF input and an RF output. The pairs of anti-series MOS capacitors include a first MOS capacitor and a second MOS capacitor electrically connected in anti-series. A bias voltage generation circuit generates bias voltages for biasing the MOS capacitors of the MOS variable capacitor cells.

A MOS capacitor, according to various embodiments, includes a gate that operates as an anode, and a source and drain that are electrically connected to one another and operate as a cathode. Additionally, a DC bias voltage between the MOS capacitor's anode and cathode can be used to control the MOS capacitor's capacitance. In certain configurations, two or more pairs of anti-series MOS capacitors are cascaded to operate as a variable capacitor cell. As used herein, a pair of MOS capacitors can be electrically connected in anti-series or inverse series when the pair of MOS capacitors is electrically connected in series with the first and second MOS capacitors' anodes electrically connected to one another or with the first and second MOS capacitors' cathodes electrically connected to one another.

The variable capacitor arrays disclosed herein can exhibit high RF signal handling and/or power handling capabilities. For example, including two or more pairs of anti-series MOS capacitors in a cascade can facilitate handling of RF signals with relatively large peak-to-peak voltage swings by distributing the RF signal voltage across multiple MOS capacitors. Thus, the variable capacitor array can handle RF signals of large voltage amplitude and/or high power without overvoltage conditions that may otherwise cause transistor damage, such as gate oxide punch through.

In certain configurations, the bias voltage generation circuit can bias the MOS capacitors of a particular variable capacitor cell at a voltage level selected from a discrete number of two or more bias voltage levels associated with high linearity. Thus, rather than biasing the MOS capacitors at a bias voltage level selected from a continuous tuning voltage range, the bias voltage generation circuit generates the MOS capacitors' bias voltages by selecting a particular cell's bias voltage level from a discrete set of bias voltage levels associated with high linearity. In one embodiment, the bias voltage generation circuit biases a particular MOS capacitor either at a first bias voltage level associated with an accumulation mode of the MOS capacitor or at a second bias voltage level associated an inversion mode of the MOS capacitor.

As used herein and as persons having ordinary skill in the art will appreciate, the terms MOS capacitors refer to any types of capacitors made from transistors with insulated gates. These MOS capacitors can have gates made from metals, such as aluminum, and dielectric regions made out of silicon oxide. However, these MOS capacitors can alternatively have gates made out of materials that are not metals, such as poly silicon, and can have dielectric regions implemented not just with silicon oxide, but with other dielectrics, such as high-k dielectrics. In certain embodiments, the MOS capacitors are implemented using fabricated using silicon on insulator (SOI) processes. For example, an integrated circuit can include a support substrate, a buried oxide (BOX) layer over the support substrate, and a device layer over the BOX layer, and the MOS capacitors can be fabricated in the device layer.

In certain embodiments, a variable capacitor array omits any switches in the signal path between the variable capacitor array's RF input and RF output. Switches can introduce insertion loss, degrade Q-factor, and/or decrease linearity. Thus, rather than providing capacitance tuning by opening and closing switches to set a number of active capacitors from a capacitor bank, capacitance tuning can be provided by biasing MOS capacitors of the variable capacitor cells at different bias voltage levels to provide a desired overall capacitance of the variable capacitor array. In certain configurations, the variable capacitor cells of the variable capacitor array can have the same or different weights or sizes, and the variable capacitor array's overall capacitance is based on a linear combination of the capacitances of the variable capacitor cells.

The variable capacitor arrays herein can have high RF voltage handling capability, while having a relatively small size, a relatively high Q-factor, a relatively high linearity, and/or a relatively low insertion loss. Furthermore, in certain implementations, a variable capacitor array can provide sufficient tuning range to provide filtering across a variety of different frequency bands. Accordingly, the variable capacitor array may be used to provide frequency tuning in a wide range of RF electronics, including, for example, programmable filters, programmable resonators, programmable antenna tuners, programmable impedance matching networks, programmable phase shifters, and/or programmable duplexers.

A wireless device such as a smart phone, tablet, or laptop computer can communicate over multiple frequency bands using one or more common or shared antennas. A desire to transmit at wider bandwidth and/or over different communications networks has increased a demand for the number of bands that a wireless device can communicate over. For example, a wireless device may be specified to operate using one or more of a variety of communications standards including, for example, GSM/EDGE, IMT-2000 (3G), 4G, Long Term Evolution (LTE), Advanced LTE, IEEE 802.11 (Wi-Fi), Mobile WiMAX, Near Field Communication (NFC), Global Positioning System (GPS), GLONASS, Galileo, Bluetooth, and the like. Proprietary standards can also be applicable. The complexities of multi-band communication can be further exacerbated in configurations in which the wireless device is specified to use carrier aggregation.

The metal oxide semiconductor (MOS) capacitors, which can offer enhanced performance over certain other tunable capacitance structures. For instance, certain microelectromechanical systems (MEMS) capacitors can exhibit low Q-factor, poor reliability, and/or limited tuning range. Additionally, other approaches such as coupled resonators can suffer from large size and/or cost, and thus can be unsuitable for certain applications, including smart phones.

Figure 7:
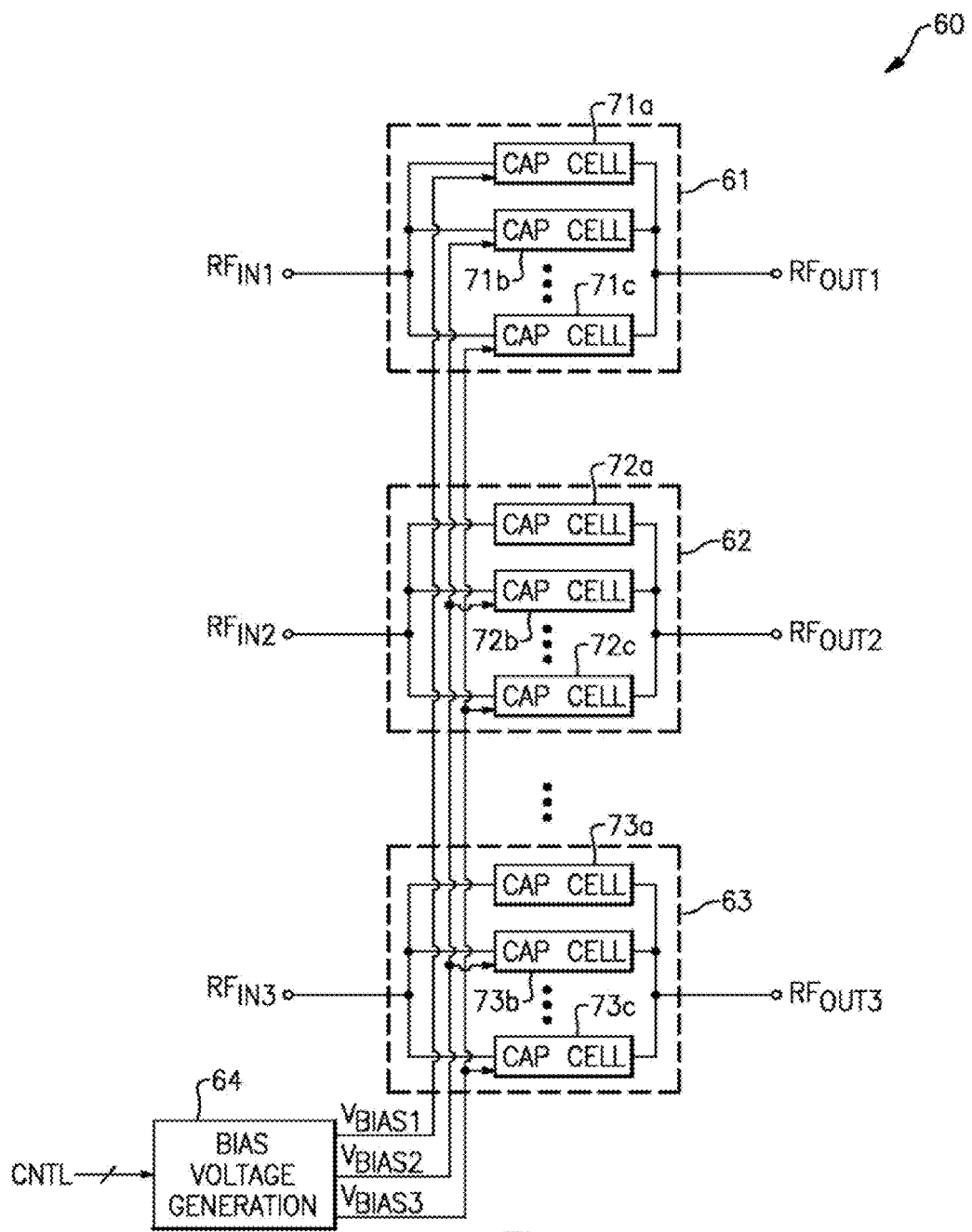
FIG. 7 illustrates a schematic diagram of an integrated circuit (IC) according to one embodiment.

FIG. 7 is a schematic diagram of an integrated circuit (IC) 60 according to one embodiment. The IC 60 includes a first variable capacitor array 61, a second variable capacitor array 62, a third variable capacitor array 63, and a bias voltage generation circuit 64. The IC 60 includes a first RF input $RF_{IN1}$, a second RF input $RF_{IN2}$, a third RF input $RF_{IN3}$, a first RF output $RF_{OUT1}$, a second RF output $RF_{OUT2}$, and a third RF output $RF_{OUT3}$.

The first variable capacitor array 61 includes a first variable capacitor cell 71a, a second variable capacitor cell 71b, and a third variable capacitor cell 71c. The first to third capacitors cells 71a-71c are electrically connected in parallel between the first RF input $RF_{IN1}$ and the first RF output $RF_{OUT1}$. The second variable capacitor array 62 includes a first variable capacitor cell 72a, a second variable capacitor cell 72b, and a third variable capacitor cell 72c. The first to third capacitors cells 72a 72c are electrically connected in parallel between the second RF input $RF_{IN2}$ and the second RF output $RF_{OUT2}$. The third variable capacitor array 63 includes a first variable capacitor cell 73a, a second variable capacitor cell 73b, and a third variable capacitor cell 73c. The first to third capacitors cells 73a 73c are electrically connected in parallel between the third RF input $RF_{IN3}$ and the third RF output $RF_{OUT3}$.

Although FIG. 7 illustrates the IC 60 as including three variable capacitor arrays, the IC 60 can be adapted to include more or fewer variable capacitor arrays. In one embodiment, the IC 60 can include between about 4 and about 16 variable capacitor arrays. In another embodiment, the IC 60 includes between about 1 and about 3 variable capacitor arrays. However, other configurations are possible.

Additionally, although FIG. 7 illustrates each variable capacitor array as including three variable capacitor cells, the variable capacitor arrays can be adapted to include more or fewer variable capacitor cells. In one embodiment, the IC 60 includes between about 6 and about 12 variable capacitor cells. However, a variable capacitor array can be adapted to include other numbers of variable capacitor cells.

The bias voltage generation circuit 64 receives the control signal CNTL, and generates a first bias voltage $V_{BIAS1}$, a second bias voltage $V_{BIAS2}$, and a third bias voltage $V_{BIAS3}$. As shown in FIG. 7, the first bias voltage $V_{BIAS1}$ is provided to the first variable capacitor cell 71a of the first variable capacitor array 61, to the first variable capacitor cell 72a of the second variable capacitor array 62, and to the first variable capacitor cell 73a of the third variable capacitor array 63. Additionally, the second bias voltage $V_{BIAS2}$ is provided to the second variable capacitor cell 71b of the first variable capacitor array 61, to the second variable capacitor cell 72b of the second variable capacitor array 62, and to the second variable capacitor cell 73b of the third variable capacitor array 63. Furthermore, the third bias voltage $V_{BIAS3}$ is provided to the third variable capacitor cell 71c of the first variable capacitor array 61, to the third variable capacitor cell 72c of the second variable capacitor array 62, and to the third variable capacitor cell 73c of the third variable capacitor array 63.

The bias voltage generation circuit 64 can be used to control the voltage levels of the first, second, and third bias voltages $V_{BIAS1}$-$V_{BIAS3}$ to control the capacitances of the first to third variable capacitor arrays 61-63.

The illustrated variable capacitor cells can be implemented using MOS capacitors. For example, in certain configurations, two or more pairs of anti-series MOS capacitors are cascaded to operate as a variable capacitor cell. Additionally, the first to third bias voltages $V_{BIAS1}$-$V_{BIAS3}$ can be used to bias the MOS capacitors at two or more bias voltages associated with a small amount of capacitance variation, and thus with high linearity. For example, in one embodiment, the first to third bias voltages $V_{BIAS1}$ $V_{BIAS3}$ can be selectively controlled to bias the MOS capacitors in accumulation or inversion to control the overall capacitance of the arrays.

In certain configurations, the MOS capacitors can be fabricated using silicon on insulator (SOI) processes. However, other configurations are possible, including, for example, implementations in which the MOS capacitors are fabricated using deep sub-micron (DSM) complementary metal oxide semiconductor (CMOS) processes.

In certain configurations herein, a variable capacitor cell can include pairs of MOS capacitors implemented using anti-series configurations. Configuring a variable capacitor cell in this manner can help cancel the second-order intermodulation tones (IM2) and/or control the variation in the cell's capacitance in the presence of RF signals.

As shown in FIG. 7, the bias voltage generation circuit 64 receives the control signal CNTL, which can be used to select the voltage levels of the first, second, and third bias voltages $V_{BIAS1}$-$V_{BIAS3}$. In certain configurations, each of the variable capacitor arrays 61-63 includes weighted banks of capacitors cells. For example, in one embodiment, the first variable capacitor cell 71a, the second variable capacitor cell 71b, and the third variable capacitor cell 71c have different capacitance weights or sizes. For example, the variable capacitor cells of a particular variable capacitor array can increase in size by a scaling factor, such as 2.

The IC 60 includes a first signal path from the first RF input $RF_{IN1}$ to the first RF output $RF_{OUT1}$ through the first variable capacitor array 61. Additionally, the IC 60 includes a second signal path from the second RF input $RF_{IN2}$ to the second RF output $RF_{OUT2}$ through the second variable capacitor array 62, and a third signal path from the third RF input $RF_{IN3}$ to the third RF output $RF_{OUT3}$ through the third variable capacitor array 63.

In certain embodiments, the IC 60 does not include any switches in the signal paths between the IC's inputs and outputs through the variable capacitor arrays. By configuring the variable capacitor arrays in this manner, the variable capacitor arrays can have lower insertion loss and/or higher linearity relative to a configuration in which capacitance is provided by selecting discrete capacitors via switches.

As shown in FIG. 7, multiple variable capacitor arrays can be fabricated on a common IC, and can share control signals but receive different RF signals. However, other configurations are possible, such as implementations in which the variable capacitor arrays receive separate control signals.

Figure 8A:
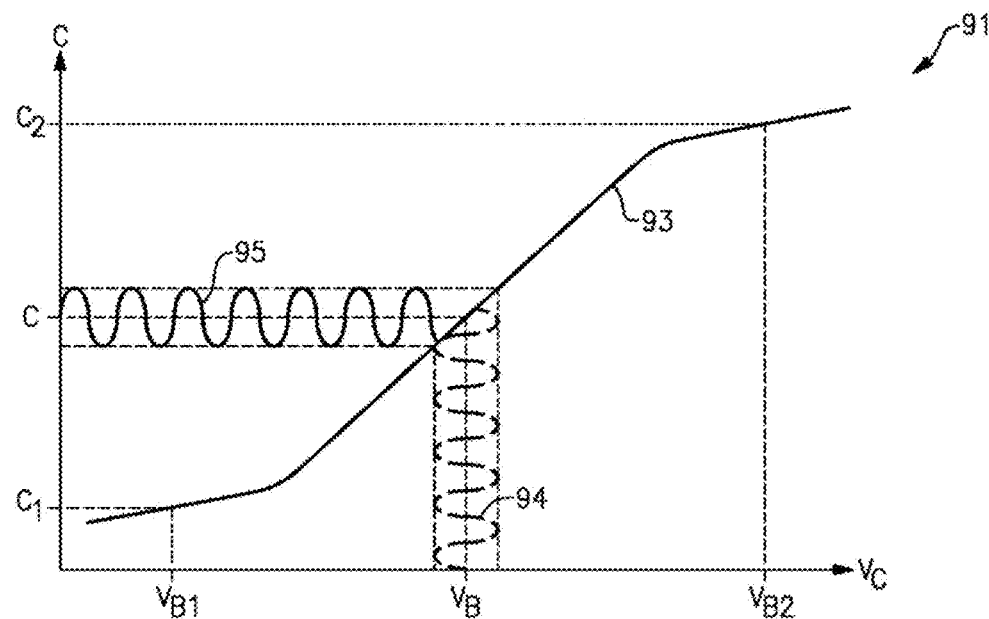
FIGS. 8A and 8B illustrate graphs of two examples of capacitance versus bias voltage.
Figure 8B:
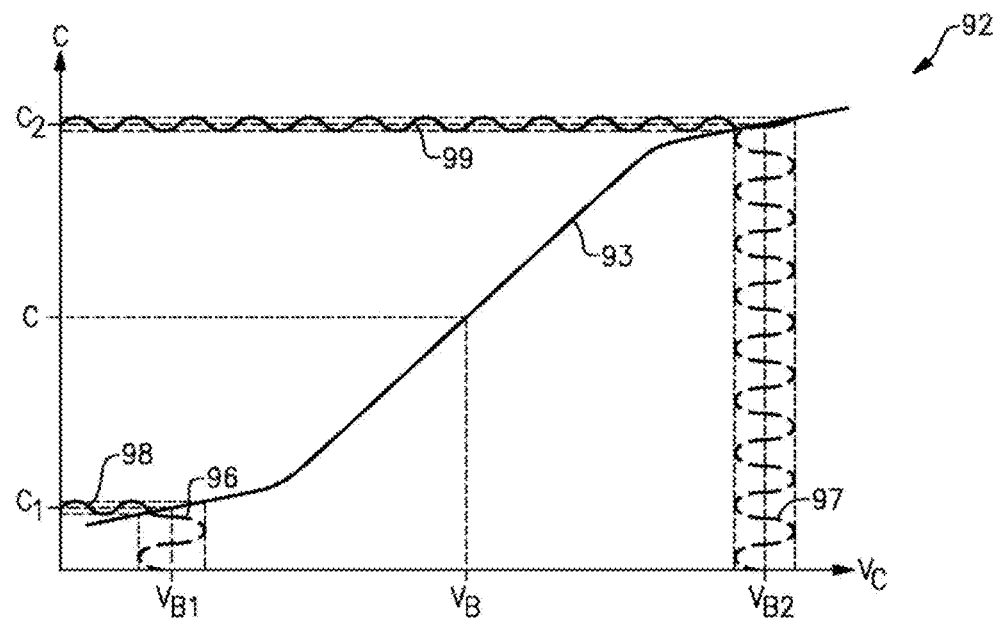

FIGS. 8A and 8B are graphs of two examples of capacitance versus bias voltage. FIG. 8A includes a first graph 91 of capacitance versus voltage, and FIG. 8B includes a second graph 92 of capacitance versus voltage.

The first graph 91 includes a high frequency capacitance-voltage (CV) plot 93 for one example of an n-type MOS capacitor. As shown in the CV plot 93, the capacitance of the MOS capacitor can increase with bias voltage level. The increase in capacitance can be associated with the MOS capacitor transitioning between operating regions or modes. For example, at low bias voltage levels, the MOS capacitor can operate in an accumulation mode in which a majority carrier concentration near the gate dielectric/semiconductor interface is greater than a background majority carrier concentration of the semiconductor. Additionally, as the voltage level of the bias voltage increases, the MOS capacitor can transition from the accumulation mode to a depletion mode in which minority and majority carrier concentrations near the gate dielectric/semiconductor interface are less than the background majority carrier concentration. Furthermore, as the voltage level of the bias voltage further increases, the MOS capacitor can transition from the depletion mode to an inversion mode in which the minority carrier concentration near the gate dielectric/semiconductor interface is greater than the background majority carrier concentration.

The first graph 91 has been annotated to include an AC signal component 94 when biasing the MOS capacitor at a bias voltage level VB. When the AC signal component 94 is not present, the MOS capacitor can have a capacitance C. However, as shown by in FIG. 8A, the AC signal component 94 can generate a capacitance variation 95. The capacitance variation 95 can be associated with a capacitance variation generated by the AC signal component 94.

With reference to FIG. 8B, the second graph 92 includes the CV plot 93, which can be as described above. The second graph 92 has been annotated to include a first AC signal component 96 associated with biasing the MOS capacitor at a first bias voltage level $V_{B1}$, and a second AC signal component 97 associated with biasing the MOS capacitor at a second bias voltage level $V_{B2}$.

As shown in FIG. 8B, the first AC signal component 96 can generate a first capacitance variation 98, and the second AC signal component 97 can generate a second capacitance variation 99.

When biased at the first bias voltage level $V_{B1}$ or the second bias voltage level $V_{B2}$, the MOS capacitor can nevertheless have a capacitance that varies in the presence of AC signals. However, the first and second bias voltage levels $V_{B1}$, $V_{B2}$ can be associated with DC bias points of the MOS capacitor having relatively small capacitance variation or change.

Accordingly, in contrast to the capacitance variation 95 of FIG. 8A which has a relatively large magnitude, the first and second capacitance variations 98, 99 of FIG. 8B have a relatively small magnitude.

In certain embodiments herein, a variable capacitor array includes MOS capacitors that are biased at bias voltages associated with small capacitance variation. By biasing the MOS capacitors in this manner, a variable capacitor array can exhibit high linearity.

Such a variable capacitor array can also have less capacitance variation when operated in a system using multiple frequency bands. For example, when included in a tunable filter, such as a tunable notch filter and a tunable mirror filter, or a tunable matching network, the variable capacitor array can provide relatively constant capacitance even when tuned to frequency bands that are separated by a wide frequency.

In certain embodiments, the first bias voltage level $V_{B1}$ is selected to operate in the MOS capacitor in an accumulation mode, and the second bias voltage level $V_{B2}$ is selected to operate the MOS capacitor in an inversion mode. In certain configurations, biasing a MOS capacitor in this manner can achieve a capacitance tuning range of 3:1 or more. However, other tuning ranges can be realized, including, for example, a tuning range associated with a particular manufacturing process used to fabricate the MOS capacitor.

Figure 9:
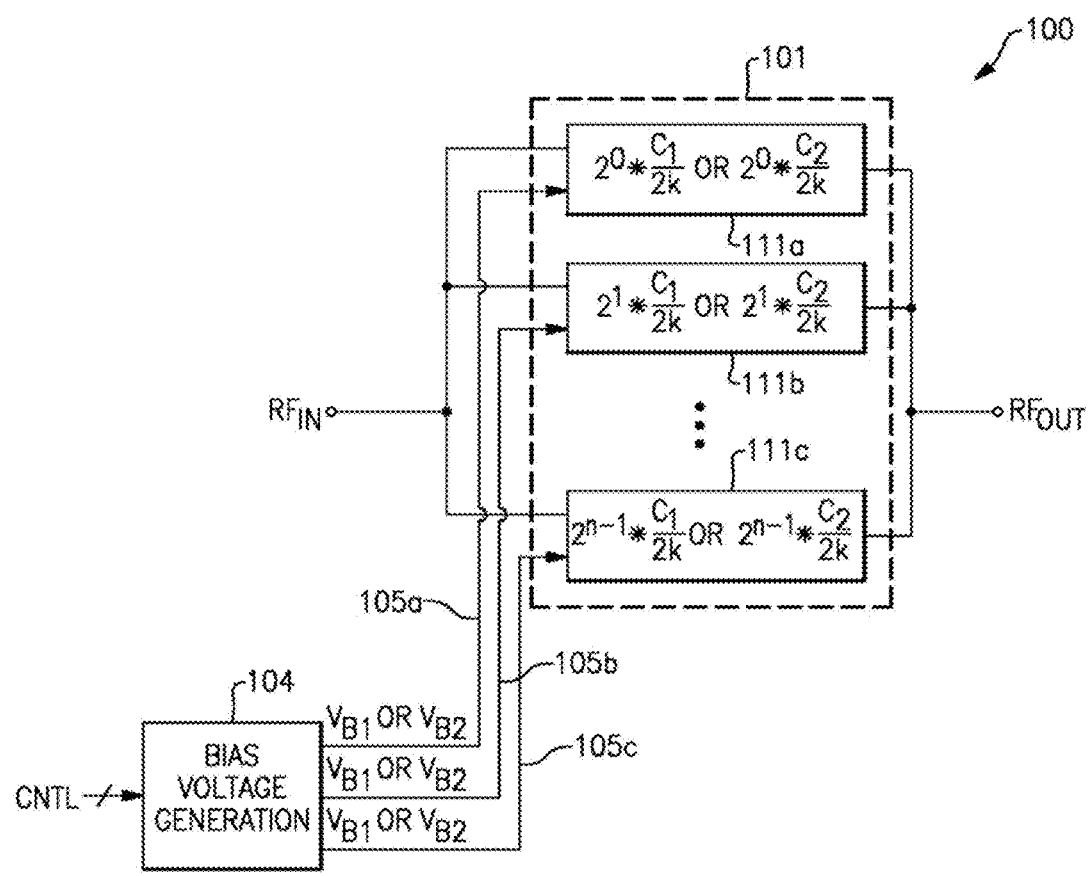
FIG. 9 illustrates a schematic diagram of an IC according to another embodiment.

FIG. 9 is a schematic diagram of an IC 100 according to another embodiment. The IC 100 includes a variable capacitor array 101 and a bias voltage generation circuit 104. Although FIG. 9 illustrates a configuration in which the IC 100 includes one variable capacitor array, the IC 100 can be adapted to include additional variable capacitor arrays and/or other circuitry.

The variable capacitor array 101 includes a first variable capacitor cell 111a, a second variable capacitor cell 111b, and a third variable capacitor cell 111c, which have been electrically connected in parallel between an RF input $RF_{IN}$ and an RF output $RF_{OUT}$. Although the illustrated variable capacitor array 101 includes three variable capacitor cells, the variable capacitor array 101 can be adapted to include more or fewer variable capacitor cells.

The bias voltage generation circuit 104 receives the control signal CNTL, and generates a first bias voltage 105a for the first variable capacitor cell 111a, a second bias voltage 105b for the second variable capacitor cell 111b, and a third bias voltage 105c for the third variable capacitor cell 111c.

In the illustrated configuration, the control signal CNTL can be used to set the voltage level of the first bias voltage 105a to a first bias voltage level $V_{B1}$ or to a second bias voltage level $V_{B2}$. Similarly, the control signal CNTL can be used to set the voltage level of the second bias voltage 105b to the first bias voltage level $V_{B1}$ or to the second bias voltage level $V_{B2}$, and to set the voltage level of the third bias voltage 105c to the first bias voltage level $V_{B1}$ or to the second bias voltage level $V_{B2}$.

By controlling the voltage levels of the bias voltages to the first or second bias voltage levels $V_{B1}$, $V_{B2}$, the variable capacitor array 101 can exhibit a small variation in capacitance in the presence of an RF signal at the RF input $RF_{IN}$. Accordingly, the variable capacitor array 101 can exhibit high linearity in the presence of RF signals.

The control signal CNTL can control an overall capacitance of the variable capacitor array 101. For example, the size of the first, second, and third MOS capacitors cells 111a-111c can be weighted relative to one another, and an overall capacitance of the variable capacitor array 101 can be based on a sum of the capacitances of the array's variable capacitor cells.

In one embodiment, the variable capacitor array's variable capacitor cells are scaled by a factor of 2, and each of the variable capacitor cells includes k pairs of anti-series MOS capacitors connected in a cascade. For example, a second variable capacitor cell of the variable capacitor array can have a size that is about a factor of 2 relative to a first variable capacitor cell of the variable capacitor array. Additionally, an nth variable capacitor cell in the array can have a size that is about $2^{n-1}$ that of the first variable capacitor cell, where n is an integer greater than or equal to 2. Although one possible variable capacitor array sizing scheme has been described, other configurations are possible.

When a variable capacitor array includes n variable capacitor cells that are scaled by a factor of 2 relative to one another and that include k pairs of anti-series MOS capacitors in a cascade, the bias voltage generation circuit 104 can control the array's first variable capacitor cell to a capacitance of $C_1/2$ k or $C_2/2$ k by biasing the first variable capacitor cell with the first bias voltage level $V_{B1}$ or the second bias voltage level $V_{B2}$. Additionally, the bias voltage generation circuit 104 can control the array's second variable capacitor cell to a capacitance of $2^1*C_1/2$ k or $2^1*C_2/2$ k by biasing the second variable capacitor cell with the first bias voltage level $V_{B1}$ or the second bias voltage level VB2. Furthermore, the bias voltage generation circuit 104 can control the array's nth variable capacitor cell to a capacitance of $2^{n-1}*C_1/2$ k or $2^{n-1}*C_2/2$ k by biasing the nth variable capacitor cell with the first bias voltage level $V_{B1}$ or the second bias voltage level $V_{B2}$.

Configuring the bias voltage generation circuit 104 to control a bias voltage to one of two voltage levels can simplify a coding scheme associated with the control signal CNTL. For example, in such a configuration, the control signal CNTL can comprise a digital control signal, and individual bits of the digital control signal can be used to control the array's bias voltages to a particular bias voltage level. Although one possible coding scheme of the control signal CNTL has been described, other configurations are possible.

Figure 10:
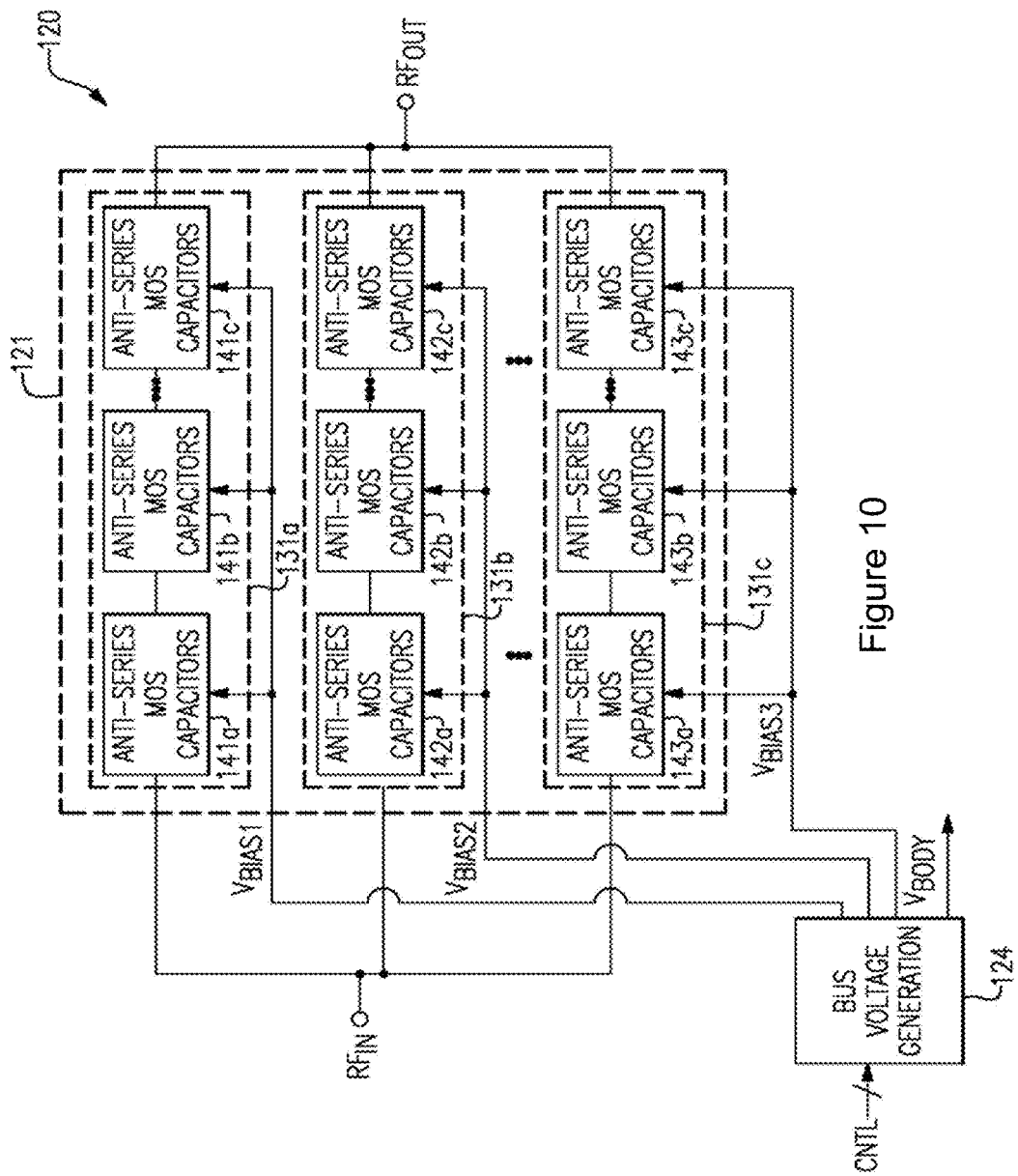
FIG. 10 illustrates a schematic diagram of an IC according to another embodiment.

FIG. 10 is a schematic diagram of an IC 120 according to another embodiment. The IC 120 includes a variable capacitor array 121 and a bias voltage generation circuit 124. Although FIG. 10 illustrates a configuration in which the IC 120 includes one variable capacitor array, the IC 100 can be adapted to include additional variable capacitor arrays and/or other circuitry.

The variable capacitor array 121 includes a first variable capacitor cell 121a, a second variable capacitor cell 121b, and a third variable capacitor cell 121c, which have been electrically connected in parallel between an RF input $RF_{IN}$ and an RF output $RF_{OUT}$. The first variable capacitor cell 121a includes a cascade of a first pair of anti-series MOS capacitors 141a, a second pair of anti-series MOS capacitors 141b, and a third pair of anti-series MOS capacitors 141c. The second variable capacitor cell 121b includes a cascade of a first pair of anti-series MOS capacitors 142a, a second pair of anti-series MOS capacitors 142b, and a third pair of anti-series MOS capacitors 142c. The third variable capacitor cell 121c includes a cascade of a first pair of anti-series MOS capacitors 143a, a second pair of anti-series MOS capacitors 143b, and a third pair of anti-series MOS capacitors 143c. Although the illustrated variable capacitor array 121 includes three variable capacitor cells, the variable capacitor array 121 can be adapted to include more or fewer variable capacitor cells. Additionally, although the illustrated variable capacitor cells each include a cascade of three pairs of anti-series MOS capacitors, the variable capacitor cells can include more or fewer pairs of anti-series MOS capacitors.

The bias voltage generation circuit 124 receives the control signal CNTL, and generates a first bias voltage $V_{BIAS1}$ for the first variable capacitor cell 131a, a second bias voltage $V_{BIAS2}$ for the second variable capacitor cell 131b, and a third bias voltage $V_{BIAS3}$ for the third variable capacitor cell 131c. In certain configurations, the bias voltage generation circuit 124 can also be used to generate a body bias voltage $V_{BODY}$, which can be used to control the body voltages of MOS capacitors of the variable capacitor array 121.

Additional details of the integrated circuit 120 can be similar to those described earlier.

FIG. 11A is a schematic diagram of a variable capacitor cell 150 according to one embodiment. The variable capacitor cell 150 includes a first pair of anti-series MOS capacitors 151, a second pair of anti-series MOS capacitors 152, a third pair of anti-series MOS capacitors 153, a first DC biasing resistor 171, a second DC biasing resistor 172, a third DC biasing resistor 173, a fourth DC biasing resistor 174, a first control biasing resistor 181, a second control biasing resistor 182, and a third control biasing resistor 183.

Although the variable capacitor cell 150 is illustrated as including three pairs of anti-series MOS capacitors, the teachings herein are applicable to configurations including more or fewer pairs of anti-series MOS capacitors. For example, in one embodiment, a variable capacitor cell includes a cascade of between 2 and 18 pairs of anti-series MOS capacitors.

In the illustrated configuration, each of the pairs of anti-series MOS capacitors 151-153 includes two MOS capacitors electrically connected in anti-series or inverse series. For example, the first pair of anti-series MOS capacitors 151 includes a first MOS capacitor 161 and a second MOS capacitor 162. The first and second MOS capacitors 161, 162 have anodes associated with transistor gates and cathodes associated with transistor source and drain regions. As shown in FIG. 11A, the anode of the first MOS capacitor 161 is electrically connected to the anode of the second MOS capacitor 162. Additionally, the second pair of anti-series MOS capacitors 152 includes a third MOS capacitor 163 and a fourth MOS capacitor 164, and the anode of the third MOS capacitor 163 is electrically connected to the anode of the fourth MOS capacitor 164. Furthermore, the third pair of anti-series MOS capacitors 153 includes fifth MOS capacitor 165 and a sixth MOS capacitor 166, and the anode of the fifth MOS capacitor 165 is electrically connected to the anode of the sixth MOS capacitor 166.

As shown in FIG. 11A, the first to third pairs of anti-series MOS capacitors 151-153 are arranged in a cascade between the RF input $RF_{IN}$ and the RF output $RF_{OUT}$. For example, the cathode of the first MOS capacitor 161 is electrically connected to the RF input $RF_{IN}$, and the cathode of the second MOS capacitor 162 is electrically connected to the cathode of the third MOS capacitor 163. Additionally, the cathode of the fourth MOS capacitor 164 is electrically connected to the cathode of the fifth MOS capacitor 165, and a cathode of the sixth MOS capacitor 166 is electrically connected to the RF output $RF_{OUT}$.

Arranging two or more pairs of anti-series MOS capacitors in a cascade can increase a voltage handling capability of a variable capacitor cell relative to a configuration including a single pair of anti-series MOS capacitors. For example, arranging two or more pairs of anti-series MOS capacitors in a cascade can increase a voltage handling and/or power handling capability of the variable capacitor cell by distributing RF signal voltage across multiple MOS capacitors.

Accordingly, cascading several pairs of anti-series MOS capacitors can achieve high voltage operation of a variable capacitor cell.

Additionally, the illustrated variable capacitor cell 150 includes pairs of MOS capacitors that are electrically connected in anti-series, which can decrease capacitance variation in the presence of RF signals. For example, when the first and second variable capacitors are each biased with a particular bias voltage, the variable capacitors' capacitance may change when an RF input signal is received on the RF input $RF_{IN}$. However, a capacitance variation $\Delta C$ between MOS capacitors in a given pair can have about equal magnitude, but opposite polarity.

For instance, in the presence of an RF input signal that generates a capacitance variation having a magnitude $\Delta C$, a first MOS capacitor of a pair of anti-series MOS capacitors may have a capacitance $C_V + \Delta C$, while the second MOS capacitor may have a capacitance $C_V - \Delta C$. Thus, the total capacitance of the anti-series combination of the first and second MOS capacitors 121, 122 can be about equal to $\frac{1}{2}C_V - \frac{1}{2}\Delta C^2/C_V$. Since $\frac{1}{2}\Delta C_2$ is typically much smaller than $\Delta C$, the anti-series MOS capacitors can exhibit small capacitance variation when RF signals propagate through the variable capacitor cell.

Accordingly, the illustrated variable capacitor cell 150 can provide reduced capacitance variation in the presence of RF signals.

In the illustrated configuration, the first to fourth DC biasing resistors 171-174 have been used to bias the cathodes of the MOS capacitors 161-166 with the first voltage $V_1$, which can be a ground, power low supply, or other reference voltage in certain implementations. Additionally, the first to third control biasing resistors 181-183 are used to bias the anodes of the MOS capacitors 161-166 with the bias voltage $V_{BIAS}$.

In one embodiment, the DC biasing resistors 171-174 have a resistance selected in the range of 10 kΩ to 10,000 kΩ, and the control biasing resistors 181-183 have a resistance selected in the range of 10 kΩ to 10,000 kΩ. Although one example of resistance values have been provided, other configurations are possible. For example, choosing relatively low resistance values for the biasing resistors can increase control over DC biasing conditions, but can also undesirably increase signal loss and/or degrade linearity since the resistors operate in shunt to an RF signal propagating through the variable capacitor cell. Accordingly, resistance values can vary depending on application, fabrication process, and/or desired performance specifications.

The bias voltages across the MOS capacitors 161-166 can be based on a voltage difference between the bias voltage $V_{BIAS}$ and the first voltage $V_1$. Additionally, a bias voltage generation circuit, such as the bias voltage generation circuit 64 of FIG. 7, can be used to control a voltage level of the bias voltage $V_{BIAS}$ to control the variable capacitor cell's capacitance between the RF input $RF_{IN}$ and the RF output $RF_{OUT}$.

In certain configurations, the bias voltage generation circuit can control the bias voltage $V_{BIAS}$ to a voltage level selected from a discrete number of two or more bias voltage levels associated with high linearity. Thus, rather than biasing the MOS capacitors at a bias voltage level selected from a continuous tuning voltage range, the bias voltage generation circuit generates the MOS capacitors' bias voltages by selecting a particular cell's bias voltage level from a discrete set of bias voltage levels associated with high linearity. In one embodiment, the bias voltage generation circuit biases a particular MOS capacitor either at a first bias voltage level associated with an accumulation mode of the MOS capacitor or at a second bias voltage level associated an inversion mode of the MOS capacitor.

Biasing the MOS capacitors 161-166 in this manner can improve linearity relative to a configuration in which the MOS capacitors 161-166 are biased at a bias voltage level selected from a continuous tuning voltage range. For example, a MOS capacitor can exhibit a change in capacitance in response to changes in an applied RF signal, and a magnitude of the capacitance change can vary with the MOS capacitor's bias voltage level.

Accordingly, the illustrated variable capacitor cell 150 can provide high linearity between the RF input $RF_{IN}$ and the RF output $RF_{OUT}$.

FIG. 11B is a circuit diagram of a variable capacitor cell 160 according to one embodiment. The variable capacitor cell 160 includes a first pair of anti-series MOS capacitors 191, a second pair of anti-series MOS capacitors 192, a third pair of anti-series MOS capacitors 193, a first DC biasing resistor 171, a second DC biasing resistor 172, a third DC biasing resistor 173, a fourth DC biasing resistor 174, a first control biasing resistor 181, a second control biasing resistor 182, and a third control biasing resistor 183. Although the variable capacitor cell 160 is illustrated as including three pairs of anti-series MOS capacitors, the teachings herein are applicable to configurations including more or fewer pairs of anti-series MOS capacitors.

The variable capacitor cell 160 of FIG. 11B is similar to the variable capacitor cell 150 of FIG. 11A, except that the variable capacitor cell 160 illustrates a different anti-series configuration of the pairs of anti-series MOS capacitors 191-193.

In particular, in contrast to the variable capacitor cell 150 of FIG. 11A in which the anodes of the MOS capacitors of a given pair are electrically connected to one another, the variable capacitor cell 160 of FIG. 11B illustrates a configuration in which the cathodes of a given pair of MOS capacitors are electrically connected to one another. For example, the first pair of MOS capacitors 191 includes a first MOS capacitor 201 and a second MOS capacitor 202, and the cathodes of the first and second MOS capacitors 201, 202 are electrically connected to one another. Similarly, the second pair of MOS capacitors 192 includes a third MOS capacitor 203 and a fourth MOS capacitor 204, and the cathodes of the third and fourth MOS capacitors 203, 204 are electrically connected to one another. Likewise, the third pair of MOS capacitors 193 includes a fifth MOS capacitor 205 and a sixth MOS capacitor 206, and the cathodes of the fifth and sixth MOS capacitors 205, 206 are electrically connected to one another.

As shown in FIG. 11B, the pairs of anti-series MOS capacitors 191-193 are electrically connected in a cascade between the RF input $RF_{IN}$ and the RF output $RF_{OUT}$. For example, the anode of the first MOS capacitor 201 is electrically connected to the RF input $RF_{IN}$, and the anode of the second MOS capacitor 202 is electrically connected to the anode of the third MOS capacitor 203. Additionally, the anode of the fourth MOS capacitor 204 is electrically connected to the anode of the fifth MOS capacitor 205, and an anode of the sixth MOS capacitor 206 is electrically connected to the RF output $RF_{OUT}$.

In the illustrated configuration, the first to fourth DC biasing resistors 171 174 are used to bias the anodes of the MOS capacitors 201-206 with the first voltage $V_1$, which can be a ground, power low supply, or other reference voltage in certain implementations. Additionally, the first to third control biasing resistors 181-183 are used to bias the cathodes of the MOS capacitors 201-206 with the bias voltage $V_{BIAS}$.

In certain configurations, the variable capacitor cell 150 of FIG. 11A can be more robust against damage from electrostatic discharge (ESD) events relative to the variable capacitor cell 160 of FIG. 11B.

For example, the RF input $RF_{IN}$ and RF output $RF_{OUT}$ of a variable capacitor cell may be electrically connected to input and output pins of an IC on which the variable capacitor cell is fabricated. Since a MOS capacitor's source and drain regions typically can withstand a greater voltage relative to the MOS capacitor's gate region when fabricated using certain manufacturing processes, the variable capacitor cell 150 of FIG. 11A may exhibit a greater robustness to ESD events or other overvoltage conditions relative to the variable capacitor cell 160 of FIG. 11B.

Additional details of the variable capacitor cell 160 can be similar to those described earlier.

Figure 12A:
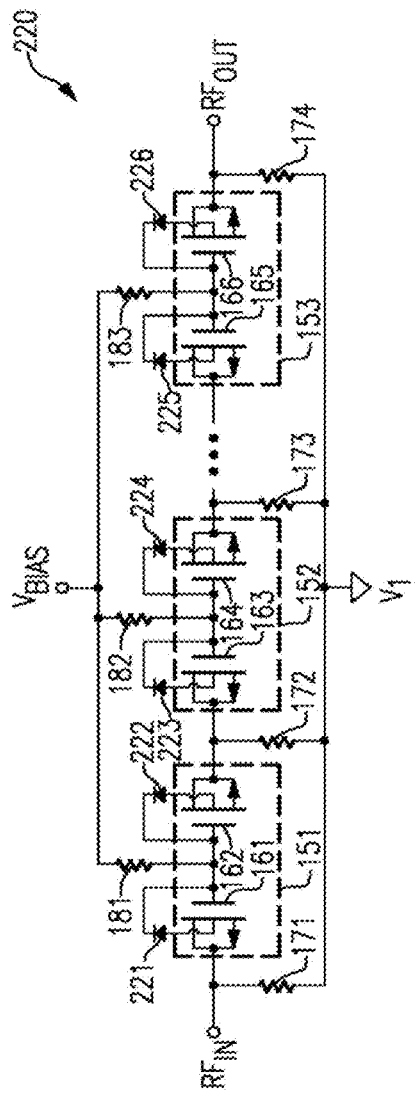
FIG. 12A illustrates a circuit diagram of a variable capacitor cell according to another embodiment.

FIG. 12A is a variable capacitor cell 220 according to another embodiment. The variable capacitor cell 220 of FIG. 12A is similar to the variable capacitor cell 150 of FIG. 11A, except that the variable capacitor cell 220 of FIG. 12A further includes a first diode 221, a second diode 222, a third diode 223, a fourth diode 224, a fifth diode 225, and a sixth diode 226.

As shown in FIG. 12A, the diodes 221-226 are electrically connected between the body and gate of the MOS capacitors 161-166, respectively. In particular, the anodes of the diodes 221-226 are electrically connected to the bodies of the MOS capacitors 161-166, respectively, and the cathodes of the diodes 221-226 are electrically connected to the gates of the MOS capacitors 161-166, respectively. The diodes 221-226 can be included in a variety of manufacturing processes, such as silicon-on-insulator (SOI) processes. In certain configurations, the diodes 221-226 are implemented as p n junction diodes. For example, an n-type MOS capacitor can include a p-type body region, and an n-type active region can be included in the p-type body region and electrically connected to the gate via metallization to provide a forward p-n junction diode from body to gate.

Including the diodes 221-226 can enhance the performance in the presence of RF signaling conditions, including, for example, enhanced performance in the presence of voltage changes to an RF signal over a signal cycle. For example, the diodes 221-226 can increase voltage headroom of the MOS capacitors 161-166 relative to a configuration in which the diodes 221-226 are omitted. Additionally, the diodes 221-226 can aid in better distributing an RF signal voltage across the MOS capacitors 161-166, thereby preventing large voltage build-up across a particular MOS capacitor in the cascade. Thus, the illustrated configuration can exhibit greater signal handling and/or power handling capability relative to a configuration that omits the diodes 221-226.

Additional details of the variable capacitor cell 220 can be similar to those described earlier.

Figure 12B:
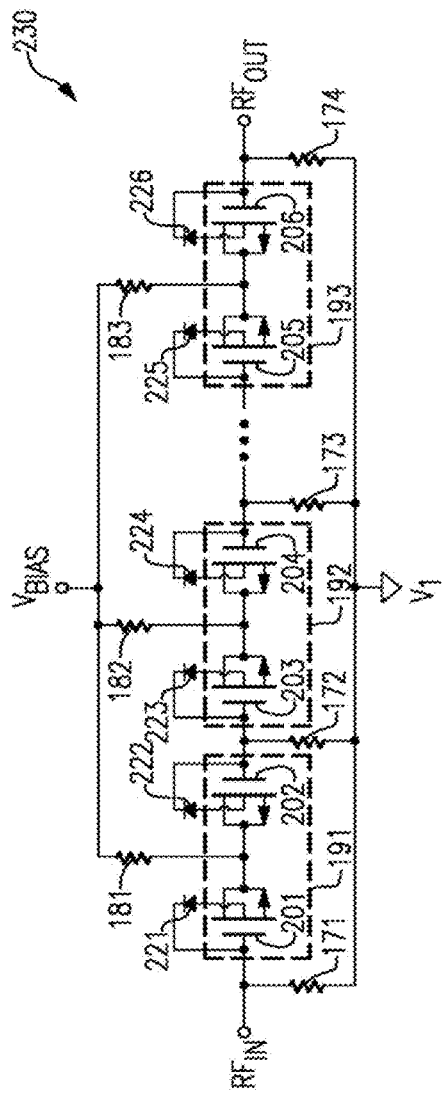
FIG. 12B illustrates a circuit diagram of a variable capacitor cell according to another embodiment.

FIG. 12B is a circuit diagram of a variable capacitor cell 230 according to another embodiment. The variable capacitor cell 230 of FIG. 12B is similar to the variable capacitor cell 160 of FIG. 11B, except that the variable capacitor cell 230 of FIG. 12B further includes the first to sixth diodes 221-226.

As shown in FIG. 12B, the anodes of the diodes 221-226 are electrically connected to the bodies of the MOS capacitors 201-206, respectively, and the cathodes of the diodes 221-226 are electrically connected to the gates of the MOS capacitors 201-206, respectively. Including the diodes 221-226 can improve RF signal voltage distribution and/or increase voltage headroom of the MOS capacitors 201-206.

Additional details of the variable capacitor cell 230 can be similar to those described earlier.

Figure 13A:
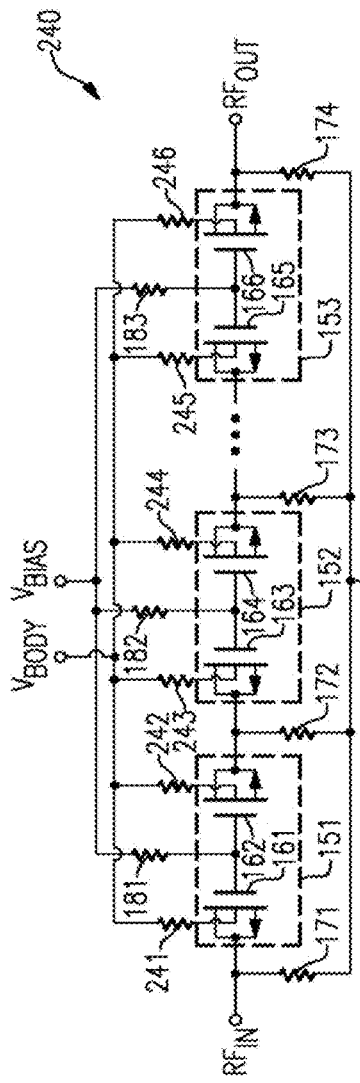
FIG. 13A illustrates a circuit diagram of a variable capacitor cell according to another embodiment.

FIG. 13A is a circuit diagram of a variable capacitor cell 240 according to another embodiment. The variable capacitor cell 240 of FIG. 13A is similar to the variable capacitor cell 150 of FIG. 11A, except that the variable capacitor cell 240 of FIG. 13A further includes a first body biasing resistor 241, a second body biasing resistor 242, a third body biasing resistor 243, a fourth body biasing resistor 244, a fifth body biasing resistor 245, and a sixth body biasing resistor 246.

The body biasing resistor 241-246 are used to bias the bodies of the MOS capacitors 161-166 with a body bias voltage $V_{BODY}$. Including the body biasing resistors 241-246 can aid in increasing the voltage headroom of the MOS capacitors 161-166 in the presence of RF voltage swing. In certain configurations, the body bias voltage $V_{BODY}$ is generated by a bias voltage generation circuit, such as the bias voltage generation circuit 124 of FIG. 10.

The body biasing resistors 241-246 can have any suitable resistance value. In one embodiment, the body biasing resistors 241-246 have a resistance selected in the range of 10 kΩ to 10,000 kΩ. Although one example of resistance values have been provided, other configurations are possible, such as resistance values selected for a particular application, fabrication process, and/or desired performance specifications.

Additional details of the variable capacitor cell 240 can be similar to those described earlier.

Figure 13B:
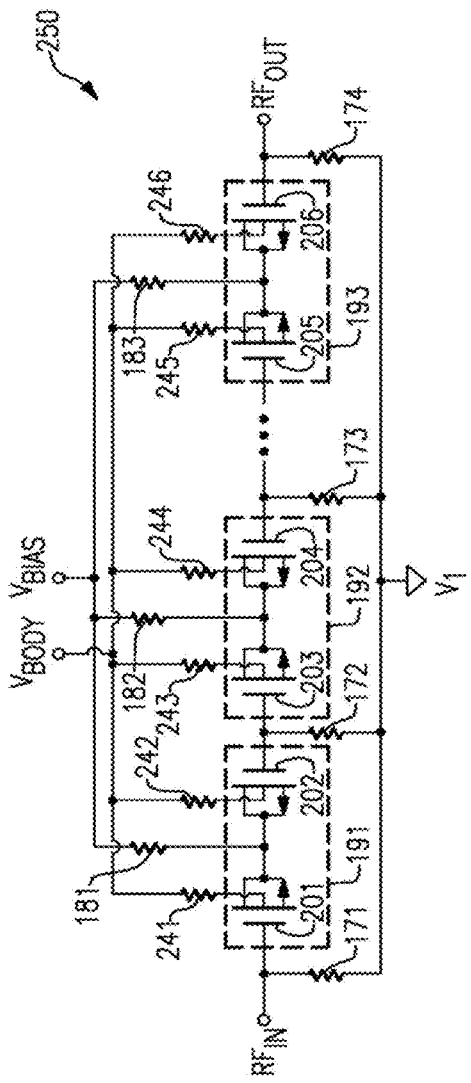
FIG. 13B illustrates a circuit diagram of a variable capacitor cell according to another embodiment.

FIG. 13B is a circuit diagram of a variable capacitor cell 250 according to another embodiment. The variable capacitor cell 250 of FIG. 13B is similar to the variable capacitor cell 160 of FIG. 11B, except that the variable capacitor cell 250 of FIG. 13B further includes the first to sixth body biasing resistors 241 246.

As shown in FIG. 13B, the body biasing resistors 241 246 are electrically connected between the body bias voltage $V_{BODY}$ and the bodies of the MOS capacitors 201-206, respectively. Including the body biasing resistors 241 246 can increase voltage headroom of the MOS capacitors 201 206 in the presence of amplitude change or swing of an RF signal.

Additional details of the variable capacitor cell 250 can be similar to those described earlier.

Figure 14A:
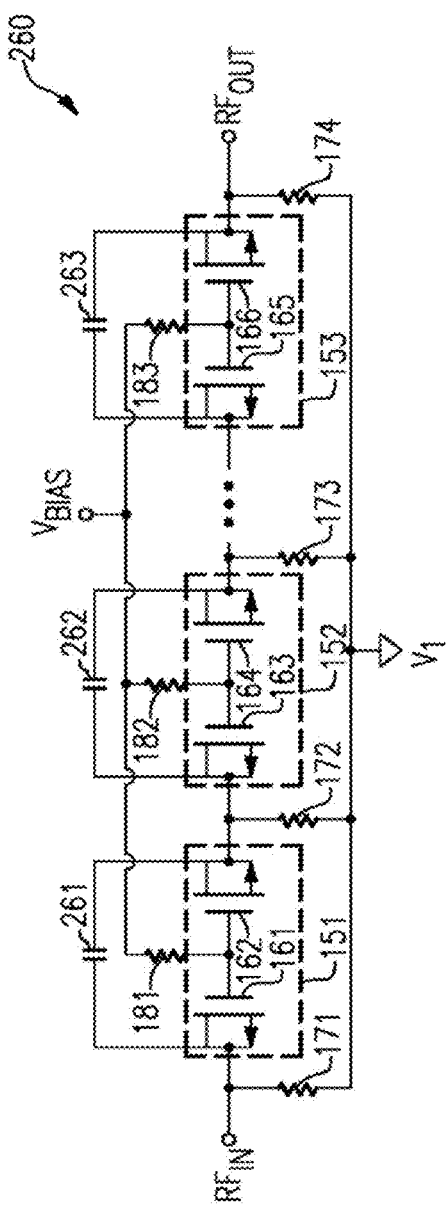
FIG. 14A illustrates a circuit diagram of a variable capacitor cell according to another embodiment.

FIG. 14A is a circuit diagram of a variable capacitor cell 260 according to another embodiment. The variable capacitor cell 260 of FIG. 14A is similar to the variable capacitor cell 150 of FIG. 11A, except that the variable capacitor cell 260 of FIG. 14A further includes a first signal swing compensation capacitor 261, a second signal swing compensation capacitor 262, and a third signal swing compensation capacitor 263.

As shown in FIG. 14A, the first signal swing compensation capacitor 261 is electrically connected in parallel with the first pair of anti-series MOS capacitors 151. For example, the first signal swing compensation capacitor 261 includes a first end electrically connected to the cathode of the first MOS capacitor 161 and a second end electrically connected to the cathode of the second MOS capacitor 162. Similarly, the second signal swing compensation capacitor 262 is electrically connected in parallel with the second pair of anti-series MOS capacitors 152, and the third signal swing compensation capacitor 263 is electrically connected in parallel with the third pair of anti-series MOS capacitors 153.

The signal swing compensation capacitors 261-263 can be used to balance or compensate for differences in voltage, current, and/or phase between pairs of anti-series MOS capacitors. Absent compensation, variation in voltage, current, and/or phase between MOS capacitors may degrade the variable capacitor cell's linearity.

In certain configurations, the capacitance values of the signal swing compensation capacitors 261-263 can be individually selected to improve voltage, current, and/or phase balancing between MOS capacitors 161-166. For example, even when the MOS capacitors 161-166 are implemented with the same size and/or geometry, the capacitance values of the signal switch compensation capacitors 261-263 can be individually selected to provide improve compensation in the presence of RF signaling conditions. In one embodiment, the first signal swing compensation capacitor 261 has a capacitance value that is greater than that of the second signal swing compensation capacitor 262, and the second signal swing compensation capacitor 262 has a capacitance value that is greater than that of the third signal swing compensation capacitor 263. Sizing the signal swing compensation capacitors in this manner may provide enhanced balancing in certain configurations, such as configurations in which large amplitude RF signals are received at the RF input $RF_{IN}$.

Additional details of the variable capacitor cell 260 can be similar to those described earlier.

Figure 14B:
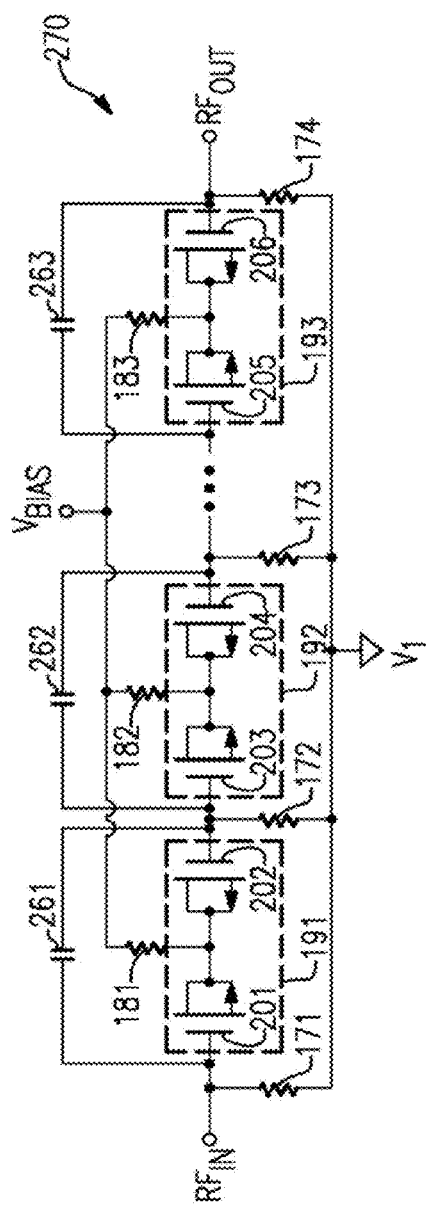
FIG. 14B illustrates a circuit diagram of a variable capacitor cell according to another embodiment.

FIG. 14B is a circuit diagram of a variable capacitor cell 270 according to another embodiment. The variable capacitor cell 270 of FIG. 14B is similar to the variable capacitor cell 160 of FIG. 11B, except that the variable capacitor cell 270 of FIG. 14B further includes the signal swing compensation capacitors 261-263.

As shown in FIG. 14B, the first signal swing compensation capacitor 261 is electrically connected in parallel with the first pair of anti-series MOS capacitors 191. For example, the first signal swing compensation capacitor 261 includes a first end electrically connected to the anode of the first MOS capacitor 201 and a second end electrically connected to the anode of the second MOS capacitor 202. Similarly, the second signal swing compensation capacitor 262 is electrically connected in parallel with the second pair of anti-series MOS capacitors 192, and the third signal swing compensation capacitor 263 is electrically connected in parallel with the third pair of anti-series MOS capacitors 193.

The signal swing compensation capacitors 261-263 can be included to balance differences in voltage, current, and/or phase between adjacent MOS capacitors, thereby improving linearity of the variable capacitor cell.

Additional details of the variable capacitor cell 270 can be similar to those described earlier.

Figure 15A:
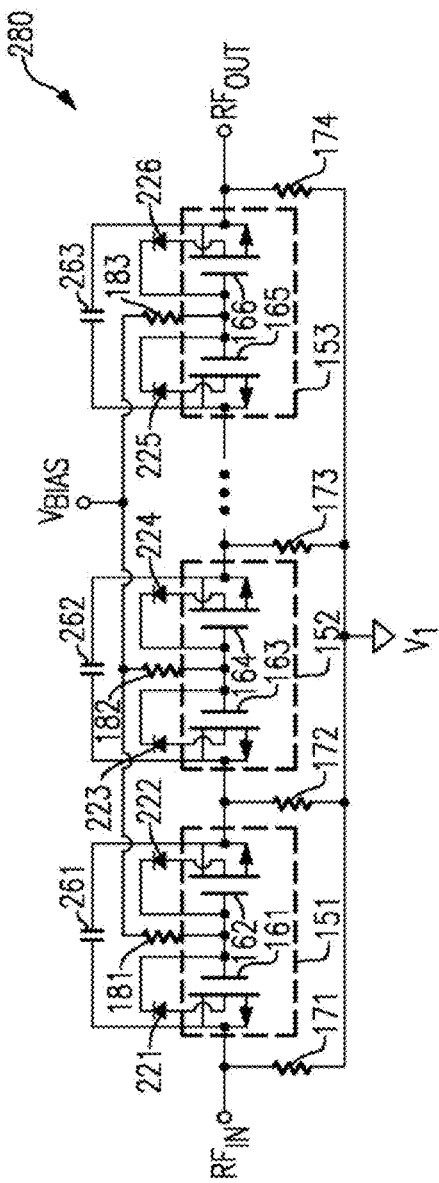
FIG. 15A illustrates a circuit diagram of a variable capacitor cell according to another embodiment.

FIG. 15A is a circuit diagram of a variable capacitor cell 280 according to another embodiment. The variable capacitor cell 280 of FIG. 15A is similar to the variable capacitor cell 150 of FIG. 11A, except that the variable capacitor cell 280 of FIG. 15A further includes the diodes 221-226 and the signal swing compensation capacitors 261-263.

Additional details of the variable capacitor cell 280 can be similar to those described earlier.

Figure 15B:
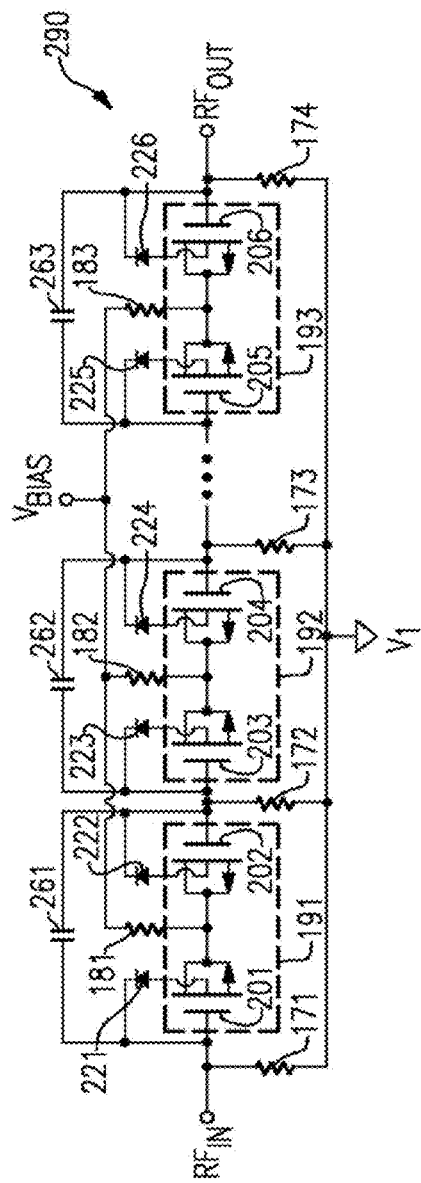
FIG. 15B illustrates a circuit diagram of a variable capacitor cell according to another embodiment.

FIG. 15B is a circuit diagram of a variable capacitor cell 290 according to another embodiment. The variable capacitor cell 290 of FIG. 15B is similar to the variable capacitor cell 160 of FIG. 11B, except that the variable capacitor cell 290 of FIG. 15B further includes the diodes 221-226 and the signal swing compensation capacitors 261-263.

Additional details of the variable capacitor cell 290 can be similar to those described earlier.

Figure 16A:
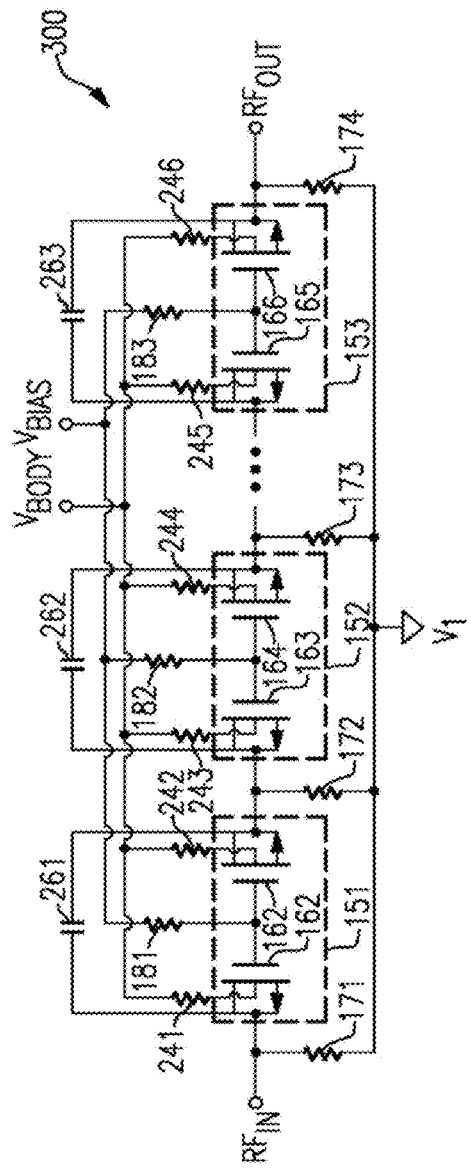
FIG. 16A illustrates a circuit diagram of a variable capacitor cell according to another embodiment.

FIG. 16A is a circuit diagram of a variable capacitor cell 300 according to another embodiment. The variable capacitor cell 300 of FIG. 16A is similar to the variable capacitor cell 150 of FIG. 11A, except that the variable capacitor cell 300 of FIG. 16A further includes the body biasing resistors 241-246 and the signal swing compensation capacitors 261-263.

Additional details of the variable capacitor cell 300 can be similar to those described earlier.

Figure 16B:
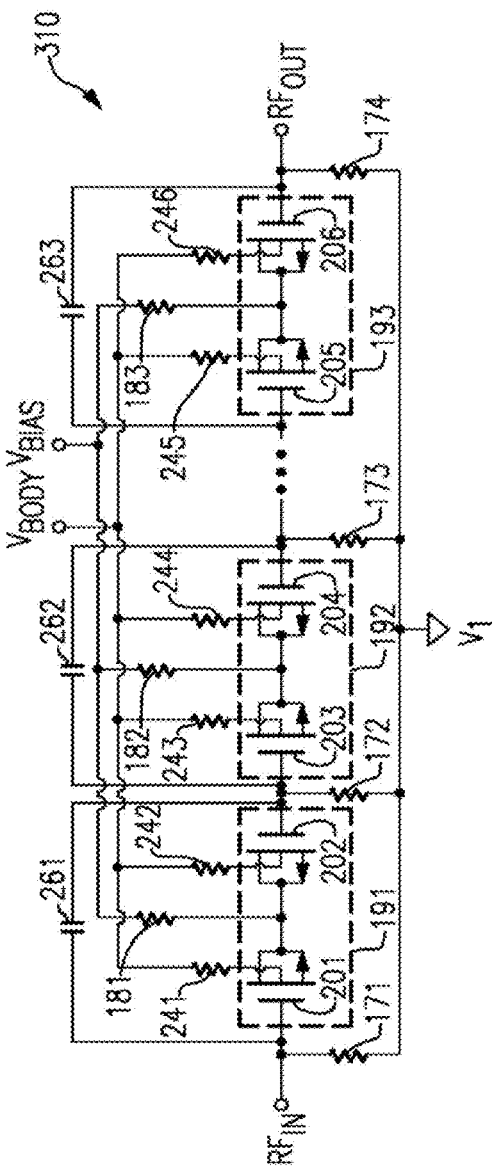
FIG. 16B illustrates a circuit diagram of a variable capacitor cell according to another embodiment.

FIG. 16B is a circuit diagram of a variable capacitor cell 310 according to another embodiment. The variable capacitor cell 310 of FIG. 16B is similar to the variable capacitor cell 160 of FIG. 11B, except that the variable capacitor cell 310 of FIG. 16B further includes the body biasing resistors 241-246 and the signal swing compensation capacitors 261-263.

Additional details of the variable capacitor cell 310 can be similar to those described earlier.

FIG. 17A is a circuit diagram of a variable capacitor cell 320 according to another embodiment. The variable capacitor cell 320 of FIG. 17A is similar to the variable capacitor cell 150 of FIG. 11A, except that the variable capacitor cell 320 of FIG. 17A further includes a first drift protection resistor 321, a second drift protection resistor 322, and a third drift protection resistor 323.

As shown in FIG. 17A, the first drift protection resistor 321 is electrically connected in parallel with the first pair of anti-series MOS capacitors 151. For example, the first drift protection resistor 321 includes a first end electrically connected to the cathode of the first MOS capacitor 161 and a second end electrically connected to the cathode of the second MOS capacitor 162. Similarly, the second drift protection resistor 322 is electrically connected in parallel with the second pair of anti-series MOS capacitors 152, and the third drift protection resistor 323 is electrically connected in parallel with the third pair of anti-series MOS capacitors 153.

The drift protection resistor 321-323 can be used to balance DC operating points across the MOS capacitors 161-166, thereby enhancing performance in the presence of RF amplitude variation or swing. As described earlier, a capacitance provided by a MOS capacitor changes with a voltage difference across the MOS capacitor's anode and cathode. Accordingly, balancing the DC operating point across the MOS capacitors 161-166 can help prevent the capacitances values of the MOS capacitors 161-166 from drifting and becoming unstable in the presence of RF signaling conditions.

In one embodiment, the drift protection resistors 321-323 have a resistance selected in the range of 5 kΩ to 1,000 kΩ. Although one example of resistance values have been provided, other configurations are possible. For example, choosing relatively low resistance values for the drift protection resistors can reduce capacitance value drift due to RF signal swing, but can also impact signaling performance since the resistors are electrically in series between the RF input $RF_{IN}$ and the RF output $RF_{OUT}$. Accordingly, resistance values can vary depending on application, fabrication process, and/or desired performance specifications.

Additional details of the variable capacitor cell 320 can be similar to those described earlier.

FIG. 17B is a circuit diagram of a variable capacitor cell 330 according to another embodiment. The variable capacitor cell 330 of FIG. 17B is similar to the variable capacitor cell 160 of FIG. 11B, except that the variable capacitor cell 330 of FIG. 17B further includes the drift protection resistors 321-323.

As shown in FIG. 17B, the first drift protection resistor 321 is electrically connected in parallel with the first pair of anti-series MOS capacitors 191. For example, the first drift protection resistor 321 includes a first end electrically connected to the anode of the first MOS capacitor 201 and a second end electrically connected to the anode of the second MOS capacitor 202. Similarly, the second drift protection resistor 322 is electrically connected in parallel with the second pair of anti-series MOS capacitors 192, and the third drift protection resistor 323 is electrically connected in parallel with the third pair of anti-series MOS capacitors 193.

The drift protection resistors 321-323 can be included to prevent the capacitances values of the MOS capacitors 201-206 from drifting and becoming unstable in the presence of RF signaling conditions.

Additional details of the variable capacitor cell 330 can be similar to those described earlier.

FIG. 18A is a circuit diagram of a variable capacitor cell 340 according to another embodiment. The variable capacitor cell 340 of FIG. 18A is similar to the variable capacitor cell 150 of FIG. 11A, except that the variable capacitor cell 340 of FIG. 18A further includes the diodes 221-226 and the drift protection resistors 321-323.

Additional details of the variable capacitor cell 340 can be similar to those described earlier.

FIG. 18B is a circuit diagram of a variable capacitor cell 350 according to another embodiment. The variable capacitor cell 350 of FIG. 18B is similar to the variable capacitor cell 160 of FIG. 11B, except that the variable capacitor cell 350 of FIG. 18B further includes the diodes 221-226 and the drift protection resistors 321-323.

Additional details of the variable capacitor cell 350 can be similar to those described earlier.

FIG. 19A is a circuit diagram of a variable capacitor cell 360 according to another embodiment. The variable capacitor cell 360 of FIG. 19A is similar to the variable capacitor cell 150 of FIG. 11A, except that the variable capacitor cell 360 of FIG. 19A further includes the body biasing resistors 241-246 and the drift protection resistors 321-323.

Additional details of the variable capacitor cell 360 can be similar to those described earlier.

FIG. 19B is a circuit diagram of a variable capacitor cell 370 according to another embodiment. The variable capacitor cell 370 of FIG. 19B is similar to the variable capacitor cell 160 of FIG. 11B, except that the variable capacitor cell 370 of FIG. 19B further includes the body biasing resistors 241-246 and the drift protection resistors 321-323.

Additional details of the variable capacitor cell 370 can be similar to those described earlier.

FIG. 20A is a circuit diagram of a variable capacitor cell 380 according to another embodiment. The variable capacitor cell 380 of FIG. 20A is similar to the variable capacitor cell 150 of FIG. 11A, except that the variable capacitor cell 380 of FIG. 20A further includes a first feed forward capacitor 381, a second feed-forward capacitor 382, and a third feed forward capacitor 383.

As shown in FIG. 20A, the first feed forward capacitor 381 is electrically connected between the RF input $RF_{IN}$ and an intermediate node of the first pair of anti-series MOS capacitors 151. For example, the first feed forward capacitor 381 is electrically connected between the RF input $RF_{IN}$ and the anodes of the first and second MOS capacitors 161, 162. Additionally, the second feed-forward capacitor 382 is electrically connected between the intermediate node of the first pair of anti-series MOS capacitors 151 and an intermediate node of the second pair of anti-series MOS capacitors 152. For example, the second feed forward capacitor 382 includes a first end electrically connected to the anodes of the first and second MOS capacitors 161, 162 and a second end electrically connected to anodes of the third and fourth MOS capacitors 163, 164. Furthermore, the third feed forward capacitor 383 is electrically connected between the intermediate node of the second pair of anti-series MOS capacitors 152 and an intermediate node of the third pair of anti-series MOS capacitors 153. For example, the third feed forward capacitor 383 includes a first end electrically connected to the anodes of the third and fourth MOS capacitors 163, 164, and a second end electrically connected to anodes of the fifth and sixth MOS capacitors 165, 166.

The feed forward capacitors 381-383 can be used to balance or compensate for differences in voltage, current, and/or phase between MOS capacitors. For example, the feed forward capacitors 381-383 can be used to balance an RF voltage drop across the MOS capacitors 161-166, thereby improving the linearity of the variable capacitor cell.

In certain configurations, the feed forward capacitors 381-383 can be individually selected to improve voltage, current, and/or phase balancing between MOS capacitors 161-166. For example, even when the MOS capacitors 161-166 are implemented with the same size and/or geometry, the capacitance values of the feed forward capacitors 381-383 can be individually selected to provide improve compensation in the presence of RF signaling conditions. In one embodiment, the first feed forward capacitor 381 has a capacitance value that is greater than that of the second feed forward capacitor 382, and the second feed forward capacitor 382 has a capacitance value that is greater than that of the third feed forward capacitor 383. Sizing the feed forward capacitors in this manner may provide enhanced balancing in certain configurations, such as configurations in which large amplitude RF signals are received at the RF input $RF_{IN}$.

Additional details of the variable capacitor cell 380 can be similar to those described earlier.

FIG. 20B is a circuit diagram of a variable capacitor cell 390 according to another embodiment. The variable capacitor cell 390 of FIG. 20B is similar to the variable capacitor cell 160 of FIG. 11B, except that the variable capacitor cell 390 of FIG. 20B further includes the feed forward capacitors 381-383.

As shown in FIG. 20B, the first feed forward capacitor 381 is electrically connected between the RF input $RF_{IN}$ and an intermediate node of the first pair of anti-series MOS capacitors 191. For example, the first feed forward capacitor 381 is electrically connected between the RF input $RF_{IN}$ and the cathodes of the first and second MOS capacitors 201, 202. Additionally, the second feed-forward capacitor 382 is electrically connected between the intermediate node of the first pair of anti-series MOS capacitors 191 and an intermediate node of the second pair of anti-series MOS capacitors 192. For example, the second feed forward capacitor 382 includes a first end electrically connected to the cathodes of the first and second MOS capacitors 201, 202 and a second end electrically connected to cathodes of the third and fourth MOS capacitors 203, 204. Furthermore, the third feed forward capacitor 383 is electrically connected between the intermediate node of the second pair of anti-series MOS capacitors 192 and an intermediate node of the third pair of anti-series MOS capacitors 193. For example, the third feed forward capacitor 383 includes a first end electrically connected to the cathodes of the third and fourth MOS capacitors 203, 204, and a second end electrically connected to cathodes of the fifth and sixth MOS capacitors 205, 206.

The feed forward capacitors 381 383 can be included to balance differences in voltage, current, and/or phase between MOS capacitors, thereby improving linearity of the variable capacitor cell.

Additional details of the variable capacitor cell 390 can be similar to those described earlier.

Figure 21A:
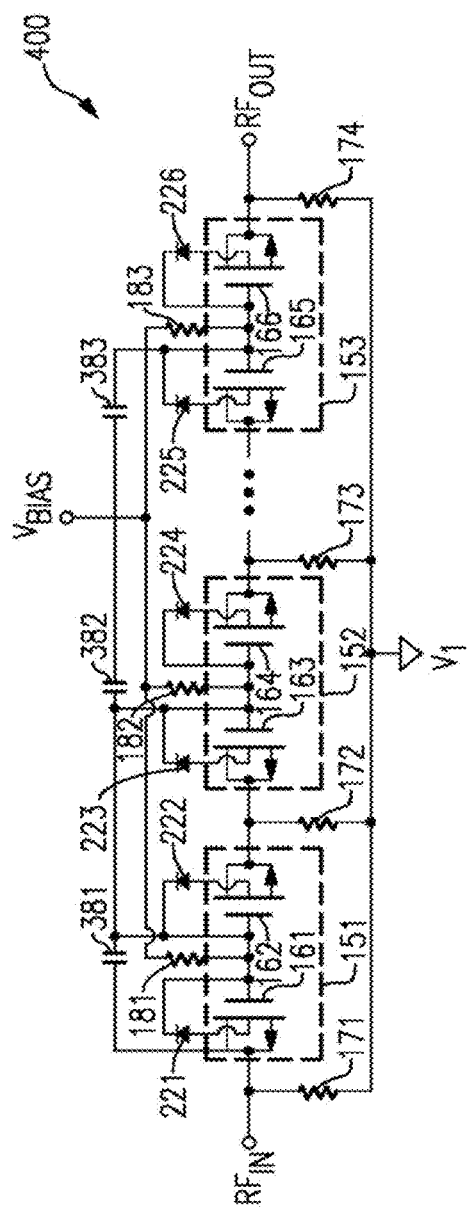
FIG. 21A illustrates a circuit diagram of a variable capacitor cell according to another embodiment.

FIG. 21A is a circuit diagram of a variable capacitor cell 400 according to another embodiment. The variable capacitor cell 400 of FIG. 21A is similar to the variable capacitor cell 150 of FIG. 11A, except that the variable capacitor cell 400 of FIG. 21A further includes the diodes 221-226 and the feed forward capacitors 381-383.

Additional details of the variable capacitor cell 400 can be similar to those described earlier.

Figure 21B:
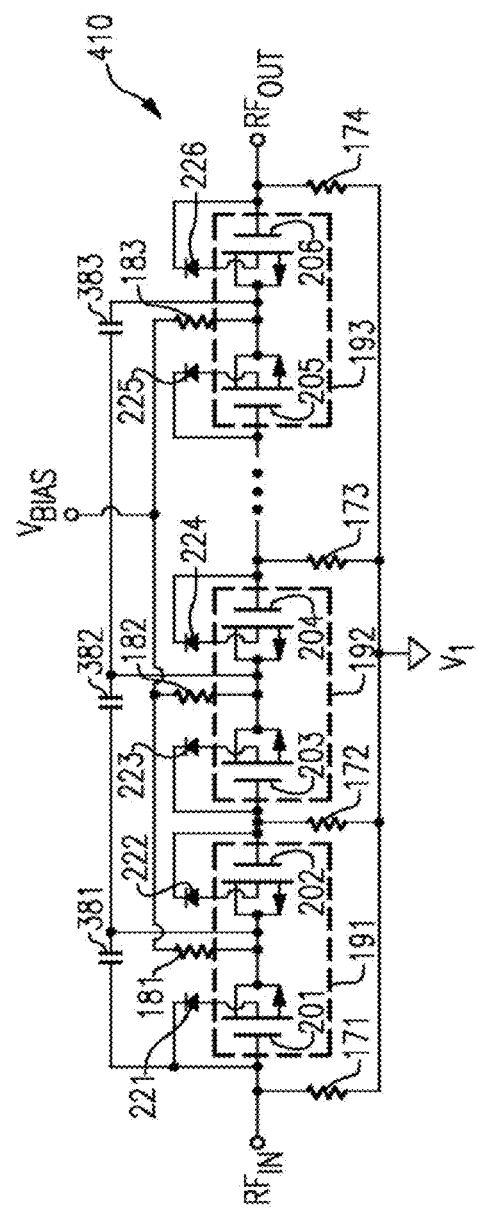
FIG. 21B illustrates a circuit diagram of a variable capacitor cell according to another embodiment.

FIG. 21B is a circuit diagram of a variable capacitor cell 410 according to another embodiment. The variable capacitor cell 410 of FIG. 21B is similar to the variable capacitor cell 160 of FIG. 11B, except that the variable capacitor cell 410 of FIG. 21B further includes the diodes 221-226 and the feed forward capacitors 381-383.

Additional details of the variable capacitor cell 410 can be similar to those described earlier.

FIG. 22A is a circuit diagram of a variable capacitor cell 420 according to another embodiment. The variable capacitor cell 420 of FIG. 22A is similar to the variable capacitor cell 150 of FIG. 11A, except that the variable capacitor cell 420 of FIG. 22A further includes the body biasing resistors 241-246 and the feed forward capacitors 381-383.

Additional details of the variable capacitor cell 420 can be similar to those described earlier.

FIG. 22B is a circuit diagram of a variable capacitor cell 430 according to another embodiment. The variable capacitor cell 430 of FIG. 22B is similar to the variable capacitor cell 160 of FIG. 11B, except that the variable capacitor cell 430 of FIG. 22B further includes the body biasing resistors 241-246 and the feed forward capacitors 381-383.

Additional details of the variable capacitor cell 430 can be similar to those described earlier.

Figure 23A:
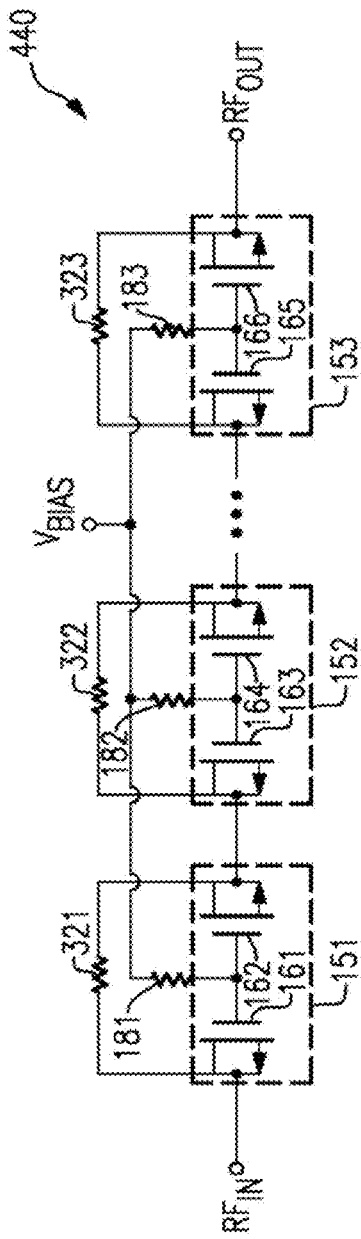
FIG. 23A illustrates a circuit diagram of a variable capacitor cell according to another embodiment.

FIG. 23A is a circuit diagram of a variable capacitor cell 440 according to another embodiment. The variable capacitor cell 440 of FIG. 23A is similar to the variable capacitor cell 320 of FIG. 17A, except that the variable capacitor cell 440 of FIG. 23A omits the first to fourth DC biasing resistors 171-174.

As described earlier, the drift protection resistor 321-323 can be used to balance DC operating points across the MOS capacitors 161-166, thereby enhancing performance in the presence of RF amplitude variation or swing. In the illustrated configuration, the first to fourth DC biasing resistors 171-174 have been omitted in favor of controlling the DC bias voltage at the cathodes of the MOS capacitors 161-166 using the drift protection resistors 321-323. For example, in the illustrated configuration, the DC bias voltage at the cathodes of the MOS capacitors 161-166 can be controlled to a DC bias voltage of the RF input $RF_{IN}$ and RF output $RF_{OUT}$. Additionally, one of the terminals $RF_{IN}$ or $RF_{OUT}$ may be grounded when used in a shunt configuration, thus eliminating the need of first to fourth DC biasing resistors 171-174.

Additional details of the variable capacitor cell 440 can be similar to those described earlier.

Figure 23B:
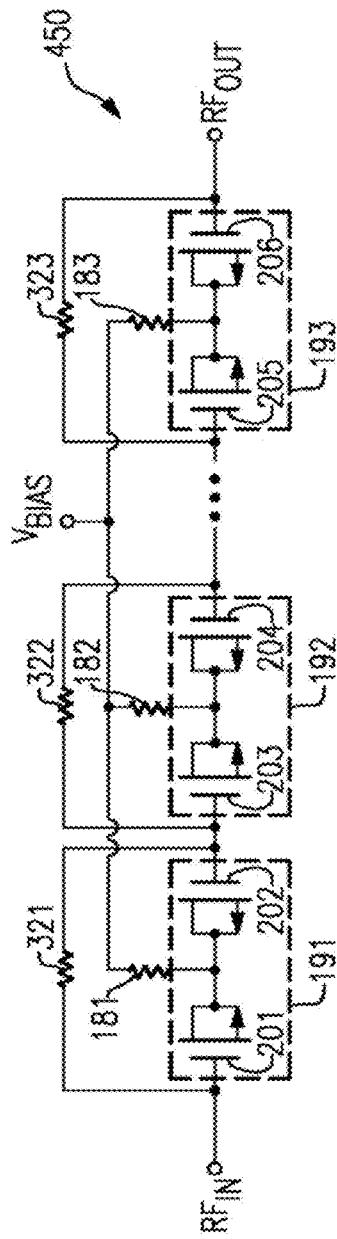
FIG. 23B illustrates a circuit diagram of a variable capacitor cell according to another embodiment.

FIG. 23B is a circuit diagram of a variable capacitor cell 450 according to another embodiment. The variable capacitor cell 450 of FIG. 23B is similar to the variable capacitor cell 330 of FIG. 17B, except that the variable capacitor cell 450 of FIG. 23B omits the first to fourth DC biasing resistors 171-174.

As shown in FIG. 23B, the first to fourth DC biasing resistors 171-174 have been omitted in favor of controlling the DC bias voltage at the anodes of the MOS capacitors 201-206 using the drift protection resistors 321-323. In the illustrated configuration, the DC bias voltage at the anodes of the MOS capacitors 201-206 can be controlled to the DC bias voltage of the RF input $RF_{IN}$ and the RF output $RF_{OUT}$.

Additional details of the variable capacitor cell 450 can be similar to those described earlier.

Although FIGS. 11A-23B illustrate implementations MOS capacitors using n-type MOS (NMOS) capacitors, the teachings herein are also applicable to configurations using p type MOS (PMOS) capacitors.

Additionally, although various embodiments of variable capacitor cells are shown in FIGS. 11A-23B, the teachings herein are also applicable to variable capacitor cells including a different combination of features. For example, to achieve a desired performance for a particular application and/or manufacturing process, a variable capacitor cell can include any suitable combination of features of the embodiments of FIGS. 11A-23B.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not only the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
   at least a first amplifier stage;
   a first notch filter coupled with said first amplifier stage, said first notch filter configured to tune to a first frequency, said first notch filter including at least one first set of metal oxide semiconductor variable capacitor arrays; and
   a first mirror notch filter coupled with said first amplifier stage, said first mirror notch filter configured to tune to said mirror of said first frequency, said first mirror notch filter including at least one second set of metal oxide semiconductor variable capacitor arrays.

2. The power amplifier of claim 1, further comprising a second amplifier stage.

3. The power amplifier of claim 2, further comprising at least a first matching network configured to couple between a first impedance and a second impedance.

4. The power amplifier of claim 3, wherein said first matching network is coupled with an output of said second amplifier stage.

5. The power amplifier of claim 2, wherein said first matching network is coupled between said first amplifier stage and said second amplifier stage.

6. The power amplifier of claim 5, further comprising at least a second matching network.

7. The power amplifier of claim 6, wherein said second matching network is coupled with an output of said second amplifier stage.

8. The power amplifier of claim 6, wherein at least one of said first matching network and said second matching network is configured to tune a matching impedance, said at least one of said first matching network and said second matching network including at least one third set of metal oxide semiconductor variable capacitor arrays.

9. The power amplifier of claim 1, wherein the first frequency is a receive frequency.

10. The power amplifier of claim 1, wherein said at least one first set of metal oxide semiconductor variable capacitor arrays and at least one second set of metal oxide semiconductor variable capacitor arrays includes at least three variable capacitor cells electrically connected in parallel.

11. The power amplifier of claim 10, wherein each of said at least three variable capacitor cells includes two or more pairs of anti-series metal oxide semiconductor capacitors.

12. A radio-frequency system comprising:
    a plurality of amplifier stages;
    a first notch filter coupled with at least a first amplifier stage of said plurality of amplifier stages, said first notch filter configured to tune to a first frequency, said first notch filter including at least one first set of metal oxide semiconductor variable capacitor arrays; and
    a first mirror notch filter coupled with at least said first amplifier stage of said plurality of amplifier stages, said first mirror notch filter configured to tune to said mirror of said first frequency, said first mirror notch filter including at least one second set of metal oxide semiconductor variable capacitor arrays.

13. The power amplifier of claim 1, wherein the first frequency is a receive frequency.

14. The power amplifier of claim 1, further comprising a second amplifier stage of said plurality of amplifier stages.

15. The power amplifier of claim 14, further comprising at least a first matching network.

16. The power amplifier of claim 15, wherein said first matching network is coupled between said first amplifier stage and said second amplifier stage.

17. The power amplifier of claim 15, wherein said first matching network is configured to tune a matching impedance, said at least one of said first matching network and said second matching network including at least one third set of metal oxide semiconductor variable capacitor arrays.

18. The power amplifier of claim 12, wherein said at least one first set of metal oxide semiconductor variable capacitor arrays and at least one second set of metal oxide semiconductor variable capacitor arrays includes at least three variable capacitor cells electrically connected in parallel.

19. The power amplifier of claim 18, wherein each of said at least three variable capacitor cells includes two or more pairs of anti-series metal oxide semiconductor capacitors.

20. A radio-frequency system comprising:
a means for amplifying a radio-frequency signal;
a means for filtering out a first frequency coupled with said means for amplifying a radio-frequency signal, said means for filtering out said first frequency including at least one first set of metal oxide semiconductor variable capacitor arrays; and
a means for filtering out a mirror of said first frequency coupled with said means for amplifying a radio-frequency signal, said means for filtering out said mirror of said first frequency including at least one second set of metal oxide semiconductor variable capacitor arrays.

\* \* \* \* \*